US009945730B2

(12) United States Patent
Bibby et al.

(10) Patent No.: US 9,945,730 B2
(45) Date of Patent: Apr. 17, 2018

(54) ADJUSTING AN AMOUNT OF COHERENCE OF A LIGHT BEAM

(71) Applicant: Cymer, LLC, San Diego, CA (US)

(72) Inventors: Thomas Frederick Allen Bibby, San Diego, CA (US); Joshua Jon Thornes, San Diego, CA (US); Rostislav Rokitski, San Diego, CA (US); Thomas Patrick Duffey, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/256,196

(22) Filed: Sep. 2, 2016

(65) Prior Publication Data

US 2018/0066995 A1  Mar. 8, 2018

(51) Int. Cl.
*G01J 9/00* (2006.01)
*G02B 26/08* (2006.01)
(Continued)

(52) U.S. Cl.
CPC .............. *G01J 9/00* (2013.01); *G01J 1/4257* (2013.01); *G02B 26/0825* (2013.01);
(Continued)

(58) Field of Classification Search
CPC .............. G01J 1/4257; G02B 26/0833; G02B 27/0955; G02B 27/0944; G03F 7/70583
See application file for complete search history.

(56) References Cited

U.S. PATENT DOCUMENTS 6,192,064 B1    2/2001  Algots et al.
6,252,666 B1 *  6/2001  Mandella .............. A61B 3/102
                                                      356/479
(Continued)

FOREIGN PATENT DOCUMENTS

JP    2012156531 A    8/2012
WO   2014200821 A1   12/2014

OTHER PUBLICATIONS

Murray et al., "Spatial Filter Issues," UCRL-JC-129751, Third Annual International Conference on Solid State Lasers or Application (SSLA) to Inertial Confinement Fusion (ICF), Monterey, CA, Jun. 7-12, 1998, Lawrence Livermore National Laboratory, 10 pages,1998, accessed from https://e-reports-ext.llnl.gov/pdf/234700.pdf.

(Continued)

*Primary Examiner* — David Porta
*Assistant Examiner* — Faye Boosalis
(74) *Attorney, Agent, or Firm* — DiBerardino McGovern IP Group LLC

(57) ABSTRACT

Techniques for controlling an optical system include accessing a measured value of a property of a particular pulse of a pulsed light beam emitted from the optical system, the property being related to an amount of coherence of the light beam; comparing the measured value of the property of the light beam to a target value of the property; determining whether to generate a control signal based on the comparison; and, if a control signal is generated based on the comparison, adjusting the amount of coherence in the light beam by modifying an aspect of the optical system based on the control signal to reduce an amount of coherence of a pulse that is subsequent to the particular pulse.

28 Claims, 12 Drawing Sheets

(51) Int. Cl.
*G01J 1/42* (2006.01)
*G03F 7/20* (2006.01)
*G02B 5/00* (2006.01)
*G02B 27/09* (2006.01)

(52) U.S. Cl.
CPC .... *G03F 7/70058* (2013.01); *G01J 2009/006* (2013.01); *G02B 5/005* (2013.01); *G02B 27/0988* (2013.01)

(56) References Cited

U.S. PATENT DOCUMENTS

| | | | |
|---|---|---|---|
| 6,392,743 | B1 | 5/2002 | Zambon et al. |
| 6,704,339 | B2 | 3/2004 | Lublin et al. |
| 7,180,605 | B2 | 2/2007 | Huber et al. |
| 7,567,607 | B2 | 7/2009 | Knowles et al. |
| 7,715,459 | B2 | 5/2010 | Brown et al. |
| 7,728,954 | B2 | 6/2010 | Baselmans et al. |
| 7,778,302 | B2 | 8/2010 | Ershov et al. |
| 7,822,092 | B2 | 10/2010 | Ershov et al. |
| 7,920,616 | B2 | 4/2011 | Brown et al. |
| 7,999,915 | B2 | 8/2011 | Ershov et al. |
| 8,014,432 | B2 | 9/2011 | Ye et al. |
| 8,170,078 | B2 | 5/2012 | Ershov et al. |
| 8,320,056 | B2 | 11/2012 | Erlandson |
| 8,767,119 | B2 | 7/2014 | Okamoto et al. |
| 9,529,182 | B2 * | 12/2016 | Chuang .............. G02B 17/0892 |
| 2012/0250709 | A1 | 10/2012 | Watanabe et al. |
| 2013/0161538 | A1 * | 6/2013 | Mei ........................ B01J 19/121 |
| | | | 250/492.1 |

OTHER PUBLICATIONS

Nixon et al., "Efficient method for controlling the spatial coherence of a laser," Department of Physics of Complex Systems, Weizmann Institute of Science, Rehovot, Israel, Department of Applied Physics, Yale University, New Haven, CT, Optical Society of America, Optics Letters, vol. 38, No. 19, Oct. 1, 2013, pp. 3858-3861 (4 total pages), http://dx.doi.org/10.1364/OL.38.003858.

Noordman et al., "Speckle in optical lithography and the influence on line width roughness," ASML Netherlands B.V., Veldhoven, The Netherlands, ASML Wilton, Wilton, CT, Carl Zeiss SMT AG, Oberkochen, Germany, Proc. of SPIE vol. 7274, 72741R1-72741R12 (12 total pages), Optical Microlithography XXII, Mar. 16, 2009, doi: 10.1117/12.814169.

Shane Thomas, U.S. International Searching Authority, International Search Report and Written Opinion, counterpart PCT Application No. PCT/US2017/047449, dated Dec. 26, 2017, 14 pages total.

* cited by examiner

ADJUSTING AN AMOUNT OF COHERENCE OF A LIGHT BEAM

TECHNICAL FIELD

This disclosure relates to adjusting an amount of coherence of a beam of light. For example, the techniques discussed below may be used to reduce or suppress coherence in a pulsed optical beam.

BACKGROUND

Photolithography is the process by which semiconductor circuitry is patterned on a substrate such as a silicon wafer. A photolithography optical source provides the deep ultraviolet (DUV) light used to expose a photoresist on the wafer. DUV light for photolithography is generated by excimer optical sources. Often, the optical source is a laser source and the pulsed light beam is a pulsed laser beam. The light beam is passed through a beam delivery unit, a reticle or a mask, and then projected onto a prepared silicon wafer. In this way, a chip design is patterned onto a photoresist that is then etched and cleaned, and then the process repeats.

SUMMARY

In one general aspect, a method of controlling an optical system includes accessing a measured value of a property of a particular pulse of a pulsed light beam emitted from the optical system, the property being related to an amount of coherence of the light beam; comparing the measured value of the property of the light beam to a target value of the property; determining whether to generate a control signal based on the comparison; and if a control signal is generated based on the comparison, adjusting the amount of coherence in the light beam by modifying an aspect of the optical system based on the control signal to reduce an amount of coherence of a pulse that is subsequent to the particular pulse.

Implementations may include one or more of the following features. The property of the light beam may include a divergence of the light beam. The divergence of the light beam may be measured outside of the optical system.

The pulse that is subsequent to the particular pulse may be the pulse that immediately follows the particular pulse.

Adjusting the amount of coherence in the light beam by modifying the value of the property of the light beam based on the control signal may include applying the control signal to an optical element of the optical system, the optical element including an optical surface that interacts with the light beam in the optical system to at least partially determine the value of the property of the light beam emitted from the optical system, the application of the control signal being sufficient to move the optical surface. The application of the control signal being sufficient to move the optical surface may include the application of the control signal being sufficient to change the shape of the optical surface, change the position of the optical surface, change the angle of the optical surface relative to a direction of propagation of the pulsed light beam, or change a curvature of the optical surface. The optical surface may include a plurality of portions, and application of the control signal is sufficient to move at least one of the plurality of portions of the optical surface relative to at least one of the other portions.

In some implementations, an operating condition of the optical system is determined, the operating condition being associated with one or more operating parameters, and if a control signal is not generated based on the comparison, the measured value of the property of the light beam may be declared as a desired value of the property for the determined operating condition. Declaring the measured value of the property of the light beam as a desired value of the property for the determined operating condition may include storing the measured value in association with the operating parameters of the operating condition. The operating parameters may include one or more of a pressure of a gain medium of the optical system, a temperature of a gain medium of the optical system, a repetition rate of the light beam emitted from the optical system, and an amount of force applied to an optical element including an optical surface that interacts with the light beam in the optical system to at least partially determine the value of the property of the light beam emitted from the optical system. An indication of a change in the operating condition of the optical system to a current operating condition may be received, the desired value of the property for the current operating condition may be determined from the stored data; and the target value may be set to the determined desired value. The indication of a change in the operating condition of the optical system may include an indication of a change in the repetition rate of the light beam emitted from the optical system to a new repetition rate, and the indication of the change in the repetition rate may be received from a lithography exposure apparatus that receives the light beam from the optical system.

In some implementations, accessing a measured value of a property of a light beam includes measuring the value of the property of the light beam at a first time and at a second time, the second time occurring after the first time and after adjusting the amount of coherence in the light beam. The value of the property of the light beam at the second time may be compared to the target value, and whether to generate a second control signal may be determined based on the comparison.

In another general aspect, a method of controlling an optical system includes obtaining a value of a property of an optical beam emitted from an optical system at a plurality of operating conditions, the obtained value of the property being associated with an amount of coherence in the optical beam, and each of the operating conditions being associated with one or more operating parameters and status information related to an optical element, the optical element including an optical surface that interacts with the light beam to at least partially determine the obtained value of the property of the light beam; storing the obtained value of the property and the status information related to the optical element for each operating condition; operating the optical system at a current operating condition, the current operating condition being associated with current values of one or more of the operating parameters and a current status information related to the optical element; receiving an indication of a change in the current operating condition of the optical system, the indication of a change including a new value of one or more of the operating parameters; determining status information related to the optical element associated with the new value from the stored data; and applying a command signal based on the determined status information to the optical element.

Implementations may include one or more of the following features. The obtained value of the property of the optical beam may be associated with an acceptable amount of coherence in the optical beam for each of the plurality of operating conditions, and another value of the property of the light beam may be obtained by measuring the value of the property of the light beam after applying the determined status information to the optical element; the another value may be compared to the obtained value of the property associated with the new value of the one or more operating parameters; and whether the another value of the property is acceptable may be determined based on the comparison.

The status information and the determined status information may include an amount of force applied to the optical element, and, if the another value of the property is not acceptable, a third amount of force may be determined based on the new force and a pre-determined constant.

The status information related to the optical element may include a position of the surface of the optical element.

The status information related to the optical element may include an amount of force applied to the optical element, the force being sufficient to determine a position of the surface of the optical element.

In another general aspect, a system for a light source includes an optical coupler; a first optical system including a first optical element; a second optical system including a second optical element; and a gain medium between the first optical system and the second optical system, where the first optical element, the second optical element, and the optical coupler define a closed path, at least a portion of the closed path passing through the gain medium, and one or more of the first optical element and the second optical element include an optically reflective surface positioned to interact with a light beam that propagates on the closed path, the surface including a plurality of portions, at least one of the portions having a surface profile that is different from the surface profiles of the other segments.

Implementations may include one or more of the following features. The first optical element may include the surface with the plurality of portions, at least one of the portions may be a mirror and at least one of the portions may be a grating. The portions may be adjacent to each other, and a flexible member may be between any two adjacent portions such that at least one portion is movable relative to an adjacent portion. In some implementations, any portion is movable relative to an adjacent portion. The surface profile of a portion may be determined by one or more of a radius of curvature and a surface characteristic of the portion.

In another general aspect, a system for a light source includes an optical coupler; a first optical system including a first reflective optical element; a second optical system including a second reflective optical element; and a gain medium between the first optical system and the second optical system, where the first reflective optical element, the second reflective optical element, and the optical coupler define a closed path, at least a portion of the closed path passing through the gain medium, the second reflective optical element includes a plurality of distinct reflective surfaces, a first of the distinct reflective surfaces positioned to receive a light beam from the gain medium and to reflect the light beam to a second of the distinct reflective surfaces, the second of the distinct reflective surfaces being positioned to receive the light beam from the first distinct reflective surface and to reflect the light beam into the gain medium, and at least one of the distinct reflective surfaces being one or more of physically separated from the other reflective surfaces and movable relative to the other reflective surfaces.

At least one of the distinct reflective surfaces of the second optical element may be movable relative to the other reflective surfaces, and the second optical system also may include an actuator coupled to the at least one movable reflective surface, the actuator being configured to cause the movable reflective surface to move in response to a command signal.

In another general aspect, a system includes an optical system configured to amplify a pulsed optical beam, the pulsed optical beam having a repetition rate, the optical system including an optical coupler; a first optical element; a gain medium; and a second optical element, the gain medium being between the first optical element and the second optical element, and the first optical element, the second optical element, and the optical coupler defining a closed path that passes through the gain medium; a lithography exposure apparatus configured to receive the amplified pulsed optical beam; and a control system coupled to the optical system and the lithography exposure apparatus, the control system configured to: receive a request to change the repetition rate of the pulsed optical beam from a first repetition rate to a second repetition rate, determine a value of property of the pulsed optical beam at the second repetition rate, determine whether the value of the property is acceptable, and if the value of the property is not acceptable, generate a command signal based on the determined value of the property, and provide the command signal to the optical system, the command signal being sufficient to physically modify a controllable optical element that interacts with light that propagates on the closed path of the optical system.

Implementations may include one or more of the following features. The value of the property of the pulsed optical beam may be a measure of coherence of one or more pulses of the pulsed optical beam.

The control system may be further configured to determine whether the value of the property is acceptable after providing the command signal to the optical system.

Determining a value of the property of the pulsed optical beam at the second repetition rate may include accessing a value of an amount of force applied to the controllable optical element, and providing the command signal to the controllable optical element may include applying a different amount of force to the controllable optical element.

Determining a value of the property of the pulsed optical beam at the second repetition rate may include measuring a divergence of the pulsed optical beam when the optical system operates at the second repetition rate.

Determining a value of the property of the pulsed optical beam at the second repetition rate may include accessing a value of the property of the pulsed optical beam stored in an electronic storage. The value of the property of the pulsed optical beam stored in an electronic storage may be a value measured previously and while the optical system operated at the second repetition rate.

The request to change the repetition rate may be received from the lithography exposure apparatus.

The control system also may include an operator interface, the operator interface being configured to allow operator interaction with the lithography exposure apparatus, and the request to change the repetition rate may be received from the operator interface.

The optical system also may include electrodes configured to excite the gain medium, and the repetition rate of the pulsed optical beam may be controllable by controlling a firing pattern of the electrodes, the firing pattern specifying when the electrodes are in an active state that is sufficient to excite the gain medium.

The controllable optical element may be one or more of the first optical element and the second optical element.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

DETAILED DESCRIPTION

Figure 1A:
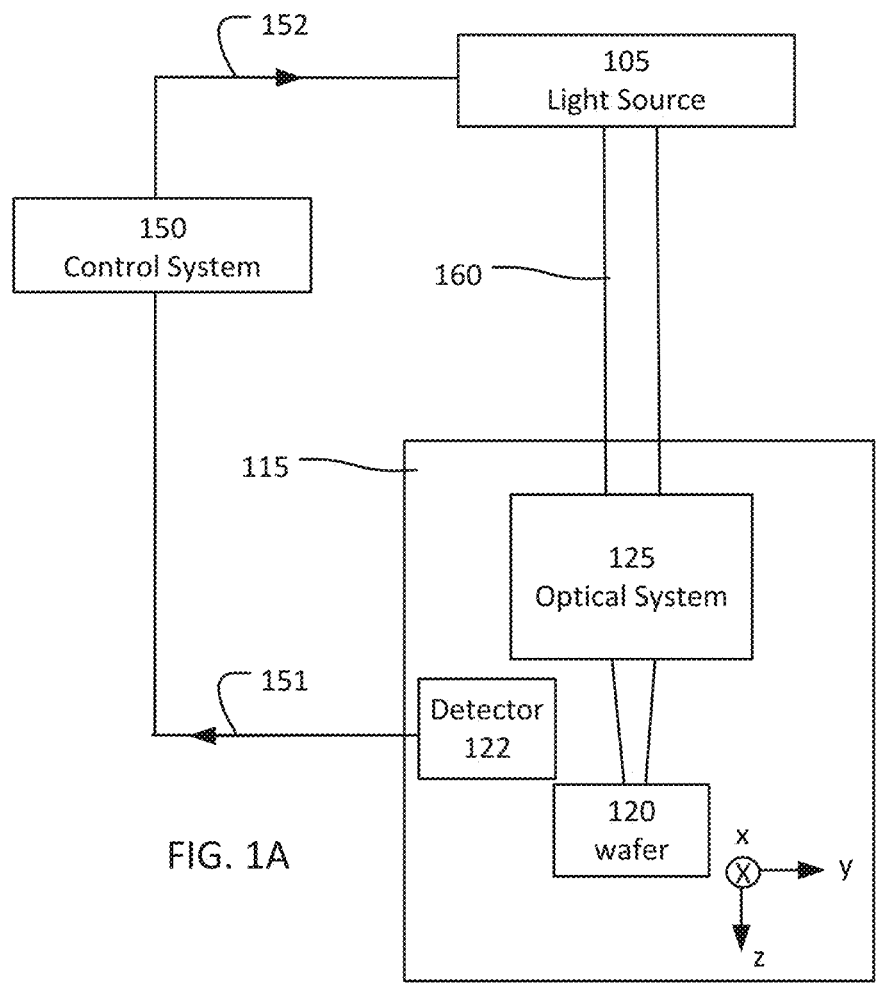
FIG. 1A is a block diagram of an example of a photolithography system.

Referring to FIG. 1A, a photolithography system 100 includes an optical (or light) source 105 that provides a light beam 160 to lithography exposure apparatus 115, which processes a wafer 120. The light beam 160 is a pulsed light beam that includes pulses of light separated from each other in time. The lithography exposure apparatus 115 includes a projection optical system 125 through which the light beam 160 passes prior to reaching the wafer 120, and a detector 122. The detector 122 may be, for example, a camera or other device that is able to capture an image of the wafer 120 or the light beam 160 at the wafer 120, or an optical detector that is able to capture data that describes characteristics of the beam 160, such as intensity of the beam 160 at the wafer 120 in the x-y plane. The lithography exposure apparatus 115 can be a liquid immersion system or a dry system. The photolithography system 100 also may include a control system 150 to control the light source 105. In implementations that include the control system 150, the control system 150 is coupled to the light source 105 and also may be coupled to the lithography exposure apparatus 115.

Figure 1B:
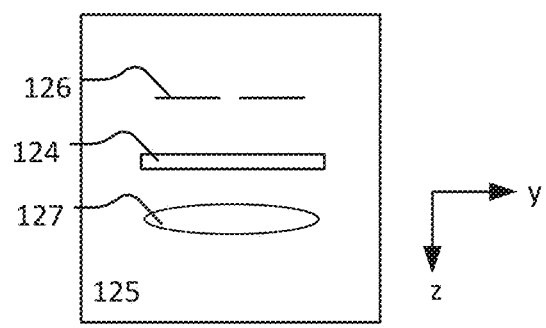
FIG. 1B is a block diagram of an example of a mask used in the photolithography system of FIG. 1A.

Microelectronic features are formed on the wafer 120 by, for example, exposing a layer of radiation-sensitive photoresist material on the wafer 120 with the light beam 160. Referring also to FIG. 1B, the projection optical system 125 includes a slit 126, a mask 124, and a projection lens 127. After reaching the projection optical system 125, the light beam 160 passes through the slit 126. In the example of FIGS. 1A and 1B, the slit 126 is rectangular and shapes the light beam 160 into an elongated rectangular shaped light beam. This shaped light beam then passes through the mask 124. A pattern is formed on the mask 124, and the pattern determines which portions of the shaped light beam are transmitted by the mask 124 and which are blocked by the mask 124. The design of the pattern is determined by the specific microelectronic circuit design that is to be formed on the wafer 120. The portions of the shaped light beam that are transmitted by the mask 124 pass through (and can be focused by) the projection lens 127 and expose the wafer 120.

The critical dimension (CD), which is the smallest feature size that can be printed on the wafer 120 by the system 100, depends on the wavelength of the light beam 160. The optical source 105 produces light having a wavelength that is nominally at a center wavelength. To maintain a uniform CD of the microelectronic features printed on the wafer 120, and on other wafers exposed by the system 100, the center wavelength of the light beam 160 should remain at an expected or target center wavelength or within a range of wavelengths around the target wavelength. Thus, in addition to maintaining the center wavelength at the target center wavelength, it is desirable to make the bandwidth of the light beam 160 (the range of wavelengths in the light beam 160) small or narrow. A variety of techniques may be used to decrease the bandwidth of the light beam 160. For example, the light beam 160 may be narrowed through interaction with a dispersive optical element, such as a grating, that removes some wavelengths from the light beam 160 while retaining others. However, such bandwidth-reducing techniques may increase the coherence of the light beam 160. Increasing the coherence may lead to speckle, the presence of which may cause an unwanted variation in the CD.

The light beam 160 is an electromagnetic field and may exhibit spatial and/or temporal coherence. The beam 160 has spatial coherence when the phase of the electromagnetic field at different locations is the same. The beam 160 has temporal coherence when the phase of the electromagnetic field at a single location is the same at different times. When the beam 160 has spatial and/or temporal coherence, the wavefronts in the beam 160 may randomly interfere with each other to produce speckle. The speckle causes spatial and/or temporal noise in the light beam 160, and the speckle may cause a speckle pattern that has a non-uniform intensity profile in the x-y plane at the optical system 125 and/or the wafer 120.

Thus, when the beam 160 is highly coherent, speckle is present in the beam 160, and the light delivered to the projection optical system 125 and/or the wafer 120 includes noise. For example, the light at the wafer 120, which is delivered by the beam 160, may have a non-uniform intensity in the x-y plane, and this non-uniformity can result in uneven exposure of the photoresist and a variation in the CD. For example, speckle may result in variation of the sizes of the exposed regions of photoresist that make up the microelectronic features, causing the features to be improperly formed and defective.

The techniques discussed below reduce the coherence of the light beam 160, thereby reducing the amount of speckle, without increasing the bandwidth of the light beam 160. As discussed in greater detail below, the coherence of the light beam 160 is reduced by changing the modal content of the light beam 160. The modal content may be changed by modifying a resonator cavity of the optical source 105, for example, through manipulation or repositioning of one or more optical elements that define the resonator cavity. An example of a resonator cavity is discussed below with respect to FIGS. 2, 4, 5A, 5B, and 5C. FIGS. 6-13 show optical elements that include one or more optical elements that are adjustable in a manner that allows the coherence of the light beam 160 to be changed. The modifications to the resonator cavity may be made at the time of manufacture, performed by a human operator in the field, or controlled in a closed-loop manner with the control system 150 while the light source 105 operates and produces light. In some implementations (such as the example discussed with respect to FIGS. 5, 14, and 15), the coherence of the light beam 160 may be changed in response to a command from the lithography exposure apparatus 115.

In some implementations, a characteristic that relates to the coherence of the light beam 160, such as, for example, a divergence of the light beam 160, is measured to determine whether the amount of coherence in the light beam 160 should be adjusted. Divergence of an electromagnetic beam (such as the light beam 160) is an angular measure of the increase in beam size as the beam propagates away from an aperture in a plane parallel to the direction of propagation. Thus, the divergence of the beam 160 may be based on an increase in the diameter of the beam 160 in a plane perpendicular to the direction of propagation. For example, in implementations in which the light beam 160 has a circular cross-section in a plane that is perpendicular to the direction of propagation, the divergence of the beam 160 may be based on an increase in the radius of the beam 160. In some implementations, the light beam 160 may have a rectangular cross-section, and the divergence of the beam may be based on an increase in either or both of the vertical and horizontal directions. The divergence of an electromagnetic wave (such as the beam 160) increases as the coherence of the wave decreases. Examples of implementations in which a property of the beam 160 may be measured to determine whether the coherence of the beam 160 should be reduced are discussed with respect to FIGS. 5, 14, and 15.

Before discussing the details of the techniques for reducing coherence of the light beam 160, example implementations of the light source 105 are discussed with respect to FIGS. 2 and 3A-3C.

Figure 2:
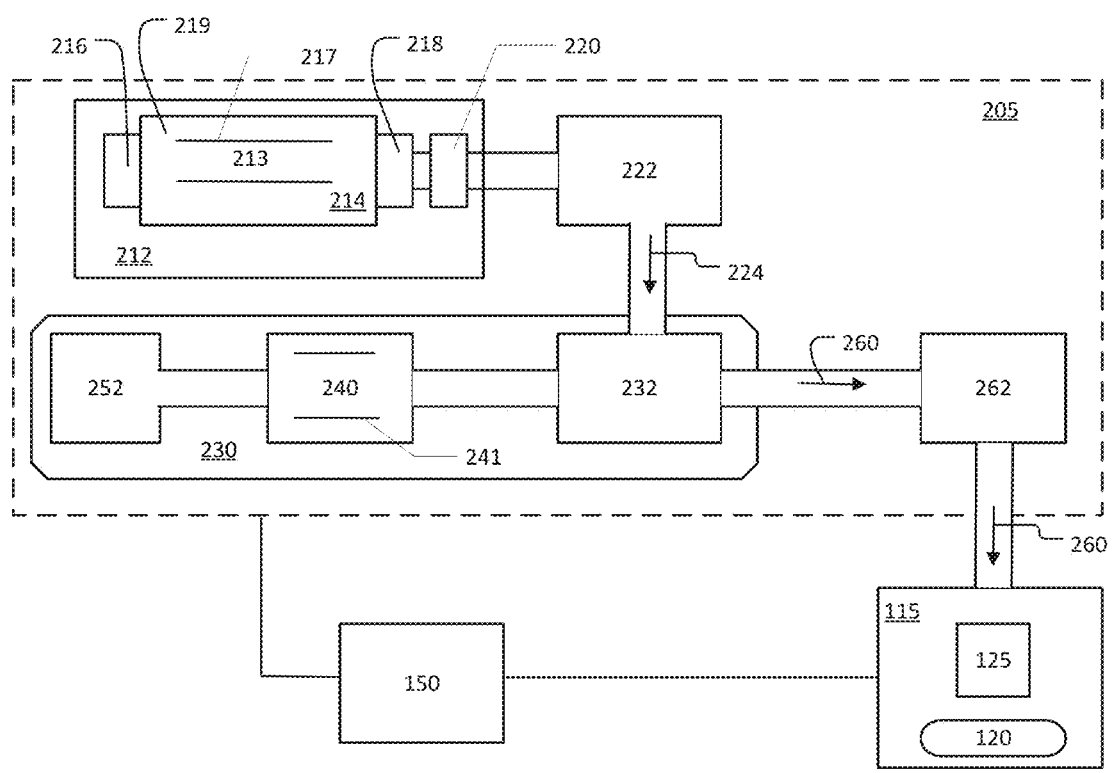
FIG. 2 is a block diagram of another exemplary photolithography system.

Referring also to FIG. 2, a block diagram of an exemplary photolithography system 200 is shown. In the photolithography system 200, an exemplary optical source 205 is used as the optical source 105 (FIG. 1). The optical source 205 produces a pulsed light beam 260, which is provided to the lithography exposure apparatus 115. The optical source 205 can be, for example, an excimer optical source that outputs the pulsed light beam 260 (which can be a laser beam). As the pulsed light beam 260 enters the lithography exposure apparatus 115, it is directed through the projection optical system 125 and projected onto the wafer 120. In this way, one or more microelectronic features are patterned onto a photoresist on the wafer 120 that is then developed and cleaned prior to subsequent process steps, and the process repeats. The photolithography system 200 also includes the control system 150, which, in the example of FIG. 2, is connected to components of the optical source 205 as well as to the lithography exposure apparatus 115 to control various operations of the system 200.

In the example shown in FIG. 2, the optical source 205 is a two-stage laser system that includes a master oscillator (MO) 212 that provides a seed light beam 224 to a power amplifier (PA) 230. The MO 212 and the PA 230 may be considered to be subsystems of the optical source 205 or systems that are part of the optical source 205. The power amplifier 230 receives the seed light beam 224 from the master oscillator 212 and amplifies the seed light beam 224 to generate the light beam 260 for use in the lithography exposure apparatus 115. For example, the master oscillator 212 can emit a pulsed seed light beam, with seed pulse energies of approximately 1 milliJoule (mJ) per pulse, and these seed pulses can be amplified by the power amplifier 230 to about 10 to 15 mJ.

The master oscillator 212 includes a discharge chamber 240 having two elongated electrodes 217, a gain medium 219 that is a gas mixture, and a fan for circulating gas between the electrodes 217. A resonator is formed between a line narrowing module 216 on one side of the discharge chamber 240 and an output coupler 218 on a second side of the discharge chamber 240. The line narrowing module 216 can include a diffractive optic such as a grating that finely tunes the spectral output of the discharge chamber 240. The master oscillator 212 also includes a line center analysis module 220 that receives an output light beam from the output coupler 218 and a beam coupling optical system 222 that modifies the size or shape of the output light beam as needed to form the seed light beam 224. The line center analysis module 220 is a measurement system that can be used to measure or monitor the wavelength of the seed light beam 224. The line center analysis module 220 can be placed at other locations in the optical source 205, or it can be placed at the output of the optical source 205.

The gas mixture used in the discharge chamber 240 can be any gas suitable for producing a light beam at the wavelength and bandwidth required for the application. For an excimer source, the gas mixture may contain a noble gas (rare gas) such as, for example, argon or krypton, a halogen, such as, for example, fluorine or chlorine and traces of xenon apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 217.

The power amplifier 230 includes a beam coupling optical system 232 that receives the seed light beam 224 from the master oscillator 212 and directs the light beam through a discharge chamber 240, and to a beam turning optical element 252, which modifies or changes the direction of the seed light beam 224 so that it is sent back into the discharge chamber 240. The discharge chamber 240 includes a pair of elongated electrodes 241, a gain medium 219 that is a gas mixture, and a fan for circulating the gas mixture between the electrodes 241.

The output light beam 260 is directed through a bandwidth analysis module 262, where various parameters (such as the bandwidth or the wavelength) of the beam 260 can be measured. The output light beam 260 can also be directed through a pulse stretcher, where each of the pulses of the output light beam 260 is stretched in time, for example, in an optical delay unit, to adjust for performance properties of the light beam that impinges the lithography exposure apparatus 115.

The control system 150 may be connected to various components of the optical source 205. For example, the control system 150 may control when the optical source 205 emits a pulse of light or a burst of light pulses that includes one or more pulses of light by sending one or more signals to the optical source 205. The light beam 260 can include one or more bursts that are separated from each other in time. Each burst can include one or more pulses of light. In some implementations, a burst includes hundreds of pulses, for example, 100-400 pulses.

Figure 3A:
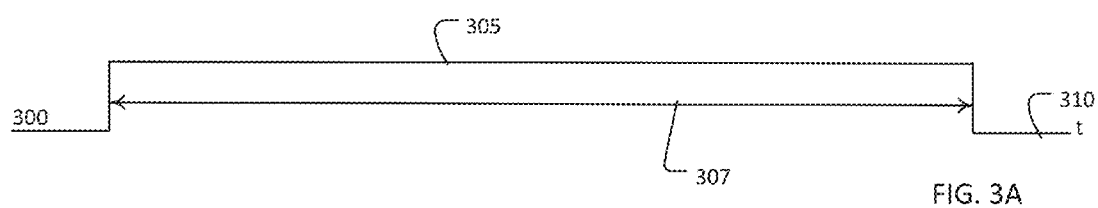
FIGS. 3A, 3B, and 3C are graphs of examples of signals that are used to control an optical source that is part of a photolithography system.
Figure 3B:
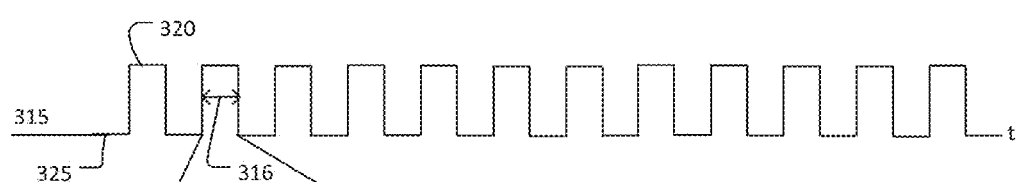
Figure 3C:
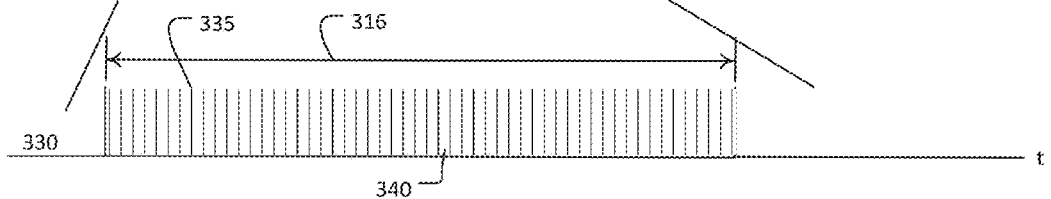

The light beam 260 (and the light beam 160) are pulsed light beams. The coherence-reducing techniques discussed below may be applied on a pulse-by-pulse basis. In other words, the amount of coherence (and, thus, the amount of speckle) may be controlled for each individual pulse. Additionally, the amount of speckle in each pulse may be controlled based on a command signal from the lithography exposure apparatus 115. Prior to discussing the coherence reducing techniques, FIGS. 3A-3C provide an overview of the production of pulses in the optical source 205. FIG. 3A shows an amplitude of a wafer exposure signal 300 as a function of time, FIG. 3B shows an amplitude of a gate signal 315 as a function of time, and FIG. 3C shows an amplitude of a trigger signal as a function of time.

The control system 150 can be configured to send the wafer exposure signal 300 to the optical source 205 to control the optical source 205 to produce the light beam 260. In the example shown in FIG. 3A, the wafer exposure signal 300 has a high value 305 (for example, 1) for a period of time 307 during which the optical source 205 produces bursts of pulses of light. The wafer exposure signal 300 otherwise has a low value 310 (for example, 0) when the wafer 120 is not being exposed.

Referring to FIG. 3B, the light beam 260 is a pulsed light beam, and the light beam 260 includes bursts of pulses. The control system 150 also controls the duration and frequency of the bursts of pulses by sending a gate signal 315 to the optical source 205. The gate signal 315 has a high value 320 (for example, 1) during a burst of pulses and a low value 325 (for example, 0) during the time between successive bursts. In the example shown, the duration of time at which the gate signal 315 has the high value is also the duration of a burst 316. The bursts are separated in time by an inter-burst time interval. During the inter-burst time interval, the lithography scanning apparatus 115 may position the next die on the wafer 120 for exposure.

Referring to FIG. 3C, the control system 150 also controls the repetition rate of the pulses within each burst with a trigger signal 330. The trigger signal 330 includes triggers 340, one of which is provided to the optical source 205 to cause the optical source 205 to produce a pulse of light. The control system 150 can send a trigger 340 to the source 205 each time a pulse is to be produced. Thus, the repetition rate of the pulses produced by the optical source 205 (the time between two successive pulses) can be set by the trigger signal 330.

As discussed above, when the gain medium 219 is pumped by applying voltage to the electrodes 217, the gain medium 219 emits light. When voltage is applied to the electrodes 217 in pulses, the light emitted from the medium 219 is also pulsed. Thus, the repetition rate of the pulsed light beam 260 is determined by the rate at which voltage is applied to the electrodes 217, with each application of voltage producing a pulse of light. The pulse of light propagates through the gain medium 219 and exits the chamber 214 through the output coupler 218. Thus, a train of pulses is created by periodic, repeated application of voltage to the electrodes 217. The trigger signal 330, for example, can be used to control the application of voltage to the electrodes 217 and the repetition rate of the pulses, which can range between about 500 and 6,000 Hz for most applications. In some implementations, the repetition rate can be greater than 6,000 Hz, and can be, for example, 12,000 Hz or greater.

The signals from the control system 150 can also be used to control the electrodes 217, 241 within the master oscillator 212 and the power amplifier 230, respectively, for controlling the respective pulse energies of the master oscillator 212 and the power amplifier 230, and thus, the energy of the light beam 260. There may be a delay between the signal provided to the electrodes 217 and the signal provided to the electrodes 241. The amount of delay may influence the amount of coherence in the pulsed light beam 260. For example, the coherence of a pulse of the seed light beam 224 may vary in time, with the front edge (the portions of the pulse that occur first in time) having the least coherence and the later-occurring portions of the pulse having the most coherence. The delay between the signal provided to the electrodes 217 and the signal provided to the electrodes 241 determines which portion of the pulse is amplified. Thus, a larger delay results in a pulse with more coherence and a shorter delay results in a pulse with less coherence.

The pulsed light beam 260 can have an average output power in the range of tens of watts, for example, from about 50 W to about 130 W. The irradiance (that is, the average power per unit area) of the light beam 260 at the output can range from 60 W/cm$^2$ to 80 W/cm$^2$.

Figure 4:
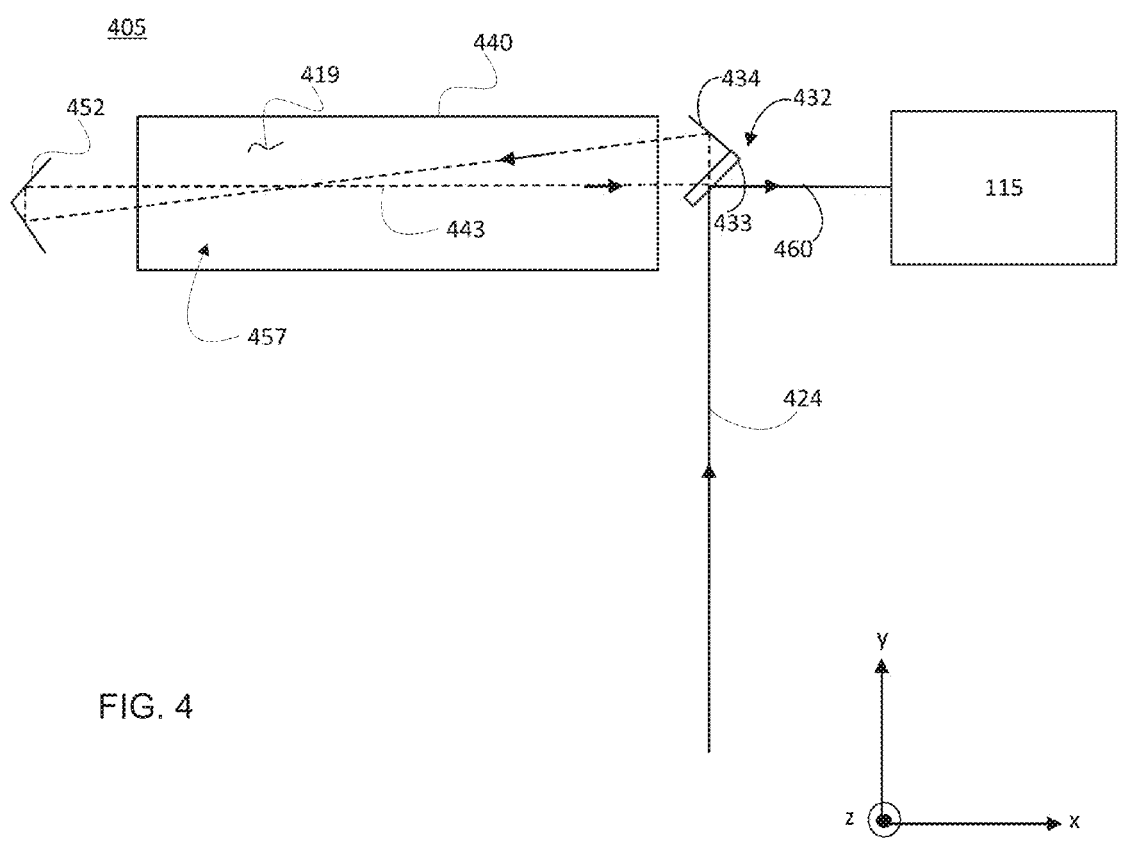
FIGS. 4 and 5A are block diagrams of another example of a photolithography system.

Referring to FIG. 4, a block diagram of an example optical lithography system 400 is shown. The optical lithography system 400 includes an optical system 405 that provides a light beam 460 to the lithography exposure apparatus 115. The optical system 405 may be similar to the power amplifier (PA) 230 discussed with respect to FIG. 2. The optical system 405 receives an input light beam 424 at a beam coupling optical system 432. The input light beam 424 may be produced by a laser or source that is similar to the master oscillator (MO) 212 of FIG. 2. In some implementations, a master oscillator similar to the MO 212 is included in the optical lithography system 400.

In the implementation shown in FIG. 4, the beam coupling optical system 432 includes an optical coupler 433 and a reflective optical element 434. The optical coupler 433 is made of a material that transmits at least some of the wavelengths in the input light beam 424, and may transmit all of the wavelengths in the input light beam 424. The input light beam 424 passes through the optical coupler 433 and is reflected from the reflective optical element 434. The reflective optical element 434 may be any type of optical element that is capable of reflecting the light beam 424. For example, the reflective optical element 434 may be a mirror. FIGS. 6-9 show examples of optical elements that may be used as the optical element 434.

The optical coupler 433 and the reflective optical element 434 are arranged relative to each other and the direction of propagation of the input light beam 424 such that the input light beam 424 passes through the optical coupler 433 and reflects from the optical element 434 into a discharge chamber 440, which includes a gain medium 419. The discharge chamber 440 and the gain medium 419 may be similar to the discharge chamber 240 and the gain medium 219, respectively, discussed above with respect to FIG. 2.

In the example of FIG. 4, the optical coupler 433 and the reflective optical element 434 are in physical contact with each other and angled such that the reflective optical element 434 directs the input beam 424 into the discharge chamber 440. However, in other implementations, the optical coupler 433 and the reflective optical element 434 may be angled relative to each other without making physical contact.

After reflecting from the reflective optical element 434, the input beam 424 propagates in the discharge chamber 440 and the gain medium 419 to a beam turning optical system 452. The beam turning optical system 452 includes at least one optical element that is positioned to turn the beam 424 such that the beam 424 changes propagation direction and passes through the gain medium 419 again. The beam 424 may pass through the gain medium 419 after being turned by the beam turning optical system 452 along a path that does not coincide with the path of the beam 424 as it travels toward the beam turning optical system 452. In this way, the beam 424 follows a closed ring path 443 (dashed line) through the discharge chamber 440. For example, the beam turning optical system 452 may include a mirror, a corner-cube reflector, a partially reflective optical element, and/or a combination of such elements. FIGS. 10-13 show examples of elements that may be used as the beam turning optical system 452.

After being turned by the beam turning optical system 452, the input beam 424 propagates in the gain medium 419 toward the beam coupling optical system 432 and is amplified. The input beam 424 impinges on the optical coupler 433, which is at least partially transmissive to the wavelengths in the input beam 424, and a portion of the input beam 424 passes through the optical coupler 433 as an output beam 460. The output beam 460 is provided to the lithography exposure apparatus 115. A portion of the input beam 424 that is not transmitted through the optical coupler 433 is reflected from the optical coupler 433 and travels about the closed path 443 again.

Figure 5A:
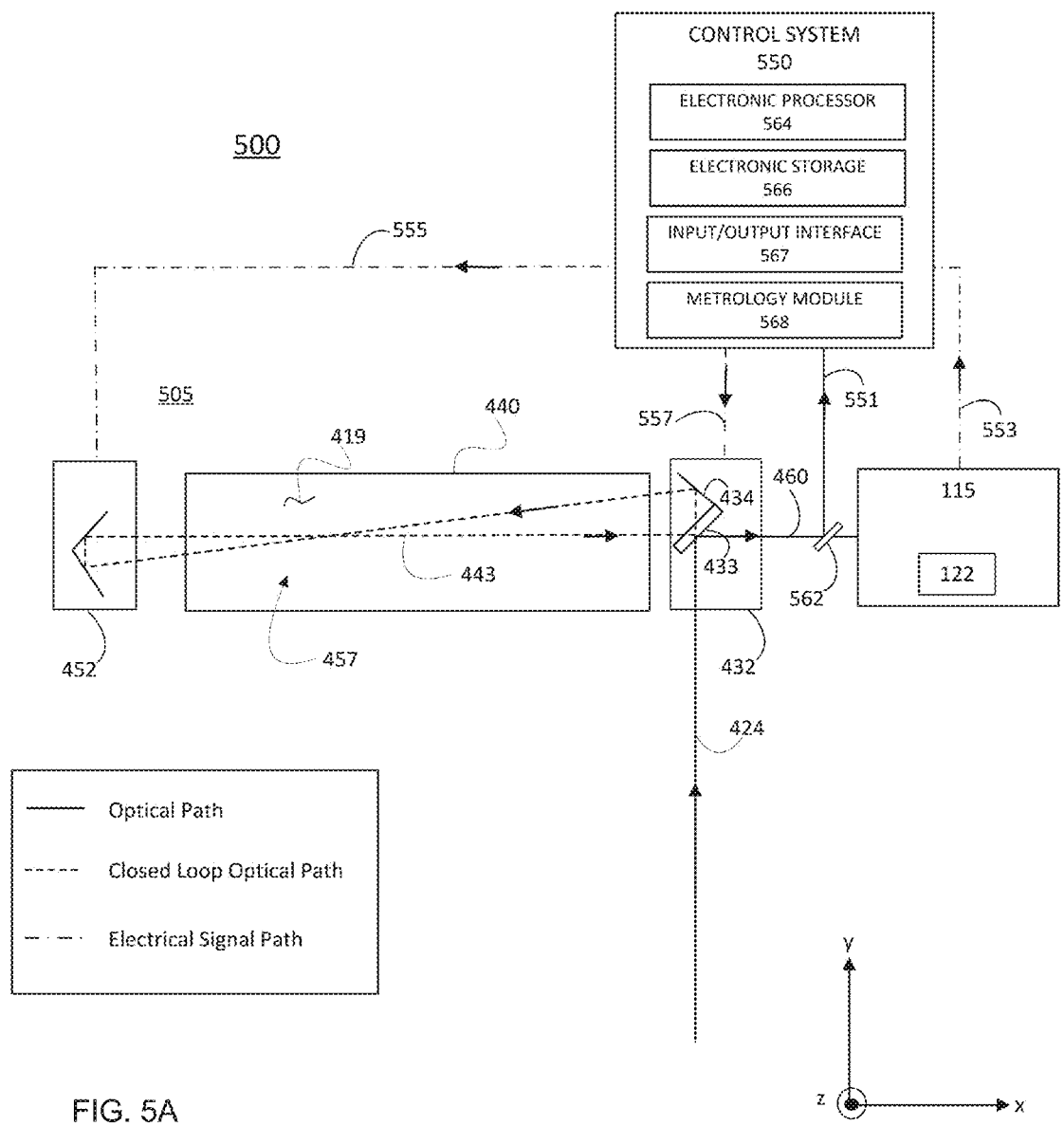

The optical coupler 433, the reflective optical element 434, and the beam turning optical system 452 define a resonator cavity 457. The cavity 457 defines the closed path 443 on which the beam 424 propagates. In FIGS. 4 and 5A, the closed path 443 is represented with a dashed line. At least a portion of the closed path 443 passes through the gain medium 419. The path 443 is closed because the light entering the path 443 intersects and overlaps itself at one or more points along the path 443. In the example of FIG. 4, the intersection occurs at the optical coupler 433. The closed path 443 may be a ring, a circular or elliptical loop, a polygonal loop, or any other loop-like closed path that has at least a portion that does not reflect back on itself. In some implementations, such as the example of FIG. 4, a portion of the closed path 443 may intersect another portion of the closed path 443 in the cavity 457.

The resonator cavity 457 also may include additional elements that are not shown in FIG. 4. For example, the resonator cavity 457 may include a dispersive optical system between the beam coupling optical system 432 and the gain medium 419. The dispersive optical system receives the beam 424 from the reflective element 434 and demagnifies the light, producing a spatially narrow beam that passes through the gain medium 419. After the beam 424 is returned from the beam turning system 452 and passes through the gain medium 419, the dispersive optical system magnifies the beam 424 prior to the beam 424 reaching the optical coupler 433. The dispersive optical system may include a collection of dispersive optical elements, such as prisms and/or gratings. The dispersive optical system may be part of the beam coupling optical system 432.

Referring to FIG. 5A, a block diagram of another exemplary optical lithography system 500, which includes an optical system 505, is shown. The optical lithography system 500 is the same as the optical lithography system 400 (FIG. 4), except the optical lithography system 500 includes a control system 550. The control system 550 provides a command signal, which may be either or both of the command signals 555 and 557, to the optical system 505 to adjust the cavity 457 during use of the optical system 505.

The optical lithography system 500 may include an optical beam monitoring optical system 562 that provides a portion 551 of the beam 460 to the control system 550. In implementations that include the optical beam monitoring optical system 562, the control system 550 and the optical beam monitoring optical system 562 implement a closed-loop feedback system that is used to adjust the amount of coherence in the beam 460 while the optical system 505 operates. Alternatively or in addition to receiving the portion 551 from the optical beam monitoring optical system 562, the control system may receive a command signal 553 from the lithography exposure apparatus 115. The command signal 553 may include data from the detector 122 that indicates an amount of coherence in the beam 460.

Regardless of whether the optical beam monitoring optical system 562 or the control signal 553 provides data to the control system 550, the control system 550 implements a closed-loop feedback system that determines a value of a property of the beam 460 based on measured data and adjusts the cavity 457 when the value indicates that the coherence of the beam 460 exceeds an acceptable amount. The acceptable amount of coherence may be a range or a single value. The range may be defined by a threshold above which the coherence is unacceptable. The closed-loop feedback system may be used to control the coherence of the beam 460 on a pulse-by-pulse basis.

Figure 5B:
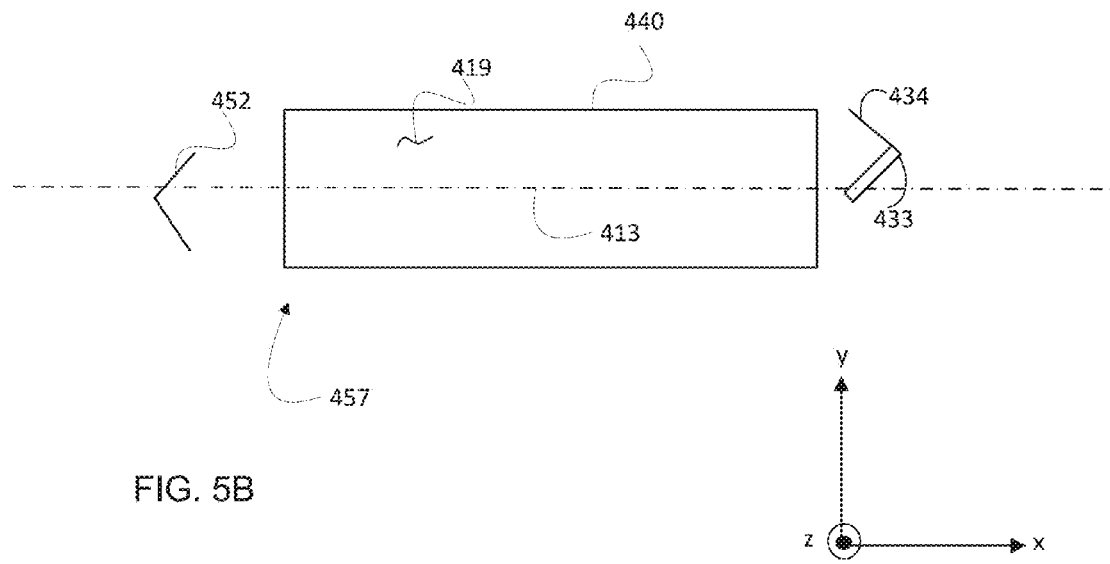
FIG. 5B is a side view in the x-y plane of a resonator cavity of the systems of FIGS. 4 and 5A.
Figure 5C:
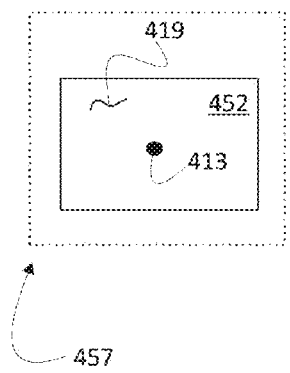
FIG. 5C is a side view in the y-z plane of the resonator cavity of FIG. 5B.

The coherence (and divergence) of the beam 460 may be adjusted by controlling the modal content of the light beam 460. The light beam 460 includes modes, which are discrete resonant conditions at least partially determined by the geometry of the cavity 457. The beam 460 includes only those electromagnetic waves that match the modes that the cavity 457 is able to support. Thus, the modes that are supported by the cavity 457 collectively make up the modal content of the light beam 460. Referring also to FIGS. 5B and 5C, which are side cross-sectional views of the cavity 457 in the x-y and y-z planes, respectively, the resonator cavity 457 supports longitudinal or axial modes (in the x-y plane and along a longitudinal axis 413 of the cavity) and lateral or transverse modes (in the y-z plane, which is perpendicular to the longitudinal axis 413).

The longitudinal modes may be considered to be a standing wave pattern formed by electromagnetic waves in the cavity 457, with the frequencies of the standing waves corresponding to the discrete frequencies included in the beam 460. The standing waves that are supported by the cavity 457 are at least partially determined by the cross-sectional geometry of the cavity 457 in the x-y plane. The lateral modes are at least partially governed by the geometry of the cavity 457 in the y-z plane. The lateral modes may have horizontal (y direction) and vertical components (z direction), and the lateral modes determine the intensity distribution of the beam 460 in the y-z plane. Thus, by changing the geometry of the cavity 457 by, for example, by changing the shape of an optical element that interacts with light in the cavity 457, the modal content of the beam 460 may be changed. For example, an element that is included in the reflective optical element 434 and/or the beam turning system 452 may change shape by being adjusted as discussed with respect to FIGS. 6-13.

The modal content of the beam 460 also may be influenced by operating conditions, such as the temperature in the cavity 457, the pressure in the cavity 457, the repetition rate of the beam 460, and the duty cycle of the beam 460. The gain medium 419 is excited by discharging electrodes in the cavity 457, and the repetition rate and duty cycle of the beam 460 are determined by the frequency and duration of the discharge. When electrodes discharge, acoustic waves form in the medium 419. The acoustic waves cause pressure variations that perturb the index of refraction of the medium 419. The perturbations of the index of refraction are local, thus, the acoustic waves may cause the index of refraction of the medium 419 to spatially vary in the discharge chamber 440. The variations in the index of refraction may alter the direction of the beam 424 that propagates in the chamber 440, and the medium 419 may be considered to act as an aperture in the cavity 457 with an unknown and/or varying transfer function. Because the medium 419 acts as an aperture in the cavity 457, the medium 419 also partially determines the modes that are able to propagate in the cavity 457. The perturbations of the index of refraction of the medium 419 thus also affect the modal content of the beam emitted from the cavity 457, thereby affecting the coherence and the divergence of the beam 460. The characteristics of the perturbations, such as, for example, the amplitude, location, and amount of the perturbations may vary with the conditions in the cavity 457. As such, changing the repetition rate of the beam 460 or any other operating condition may change the coherence of the beam 460 in an unpredictable manner. Thus, it may be desirable to monitor the beam 460 to determine whether the cavity 457 should be adjusted to reduce the coherence of the beam 460 while the system 500 is operating and producing the beam 460.

The control system 550 allows the beam 460 to be monitored and the coherence of the beam 460 controlled through adjustment of the reflective optical element 434 and/or the beam turning optical system 452 during operation of the system 500.

The control system 550 may receive commands through an input/output (I/O) interface 567. The commands may originate from the lithography exposure apparatus 115 and/or come directly from an operator or an automated process. The control system 550 also may receive a command signal 553, which may include data related to the beam 460, from the detector 122. In some implementations, the control system 550 receives data related to the beam 460 from the metrology module 568. The control system 550 provides command signals 555, 557 to either or both of the beam turning system 452 and the beam coupling optical system 432, respectively.

The control system 550 includes an electronic processor 564, an electronic storage 566, the input/output (I/O) interface 567, and the metrology module 568. The metrology module 568 receives the portion 551 of the beam 460 from the optical beam monitoring optical system 562 and determines a property of the beam 460 based on the portion 551. The metrology module 568 may include any optical element, a collection of optical elements, and/or instrumentation that measures one or more properties of the beam 460. For example, the metrology module 568 may include a camera that images the portion of the beam 460 provided by the optical beam monitoring optical system 562. Images from the camera may be used to determine properties of the beam 460 such as beam divergence and intensity. The metrology module 568 may include other elements that are able to assess the properties of the beam 460. For example, the metrology module 568 may include variable apertures, pinholes, and other spatial filters that may be used to measure beam divergence. The metrology module 568 also may include other optical elements such as mirrors and lenses that receive and direct the light from the optical beam monitoring optical system 562.

The optical beam monitoring optical system 562 may include any device capable of directing a portion of the beam 460 to the metrology module 568. For example, the optical beam monitoring optical system 562 may be a beam splitter that directs some of the beam 460 toward the control. In the example shown in FIG. 5A, the beam monitoring optical system 562 obtains a sample of the beam 460 that has passed through the beam coupling optical system 432. However, the beam monitoring optical system 562 may be placed in other locations. For example, the beam monitoring optical system 562 may be inside the lithography exposure apparatus 115. In some implementations, the optical lithography system 500 includes a bandwidth analysis module (BAM) between the beam coupling optical system 432 and the lithography exposure apparatus 115. The BAM may be similar to the bandwidth analysis module 262 of FIG. 2, and the BAM measures various parameters of the beam 560, such as, for example, the bandwidth and/or the wavelength. In these implementations, the beam monitoring optical system 562 may be placed between the BAM and the lithography exposure apparatus 115.

The control system 550 also includes the electronic processor 564, the electronic storage 566, and the I/O interface 567. The electronic processor 564 includes one or more processors suitable for the execution of a computer program such as a general or special purpose microprocessor, and any one or more processors of any kind of digital computer. Generally, an electronic processor receives instructions and data from a read-only memory, a random access memory, or both. The electronic processor 564 may be any type of electronic processor.

The electronic storage 566 may be volatile memory, such as RAM, or non-volatile memory. In some implementations, and the electronic storage 566 includes non-volatile and volatile portions or components. The electronic storage 566 may store data and information that is used in the operation of the control system 550 and/or components of the control system 550. The information may be stored in, for example, a look-up table or a database. For example, the electronic storage 566 may store data that indicates values of various properties of the beam 460 under different operating conditions and performance scenarios. For example, the electronic storage 566 may store beam divergence values that correspond to optimal performance of the optical system 505 at different repetition rates and cavity 457 temperatures. Additionally or alternatively, the electronic storage 566 may store settings that pertain to either or both of the beam turning system 452 and the beam coupling optical system 432.

The electronic storage 566 also may store instructions, perhaps as a computer program, that, when executed, cause the processor 564 to communicate with components in the control system 550, the optical system 505, and/or the lithography exposure apparatus 115. For example, the instructions may be instructions that cause the electronic processor 564 to determine an amount of divergence of the beam 460 based on information from the metrology module 568. In some implementations, the instructions are instructions that cause the control system 550 to generate and provide a command signal to one or more components of the beam turning system 452 or the beam coupling optical system 432 to move the component to modify the resonator cavity 457 and reduce the coherence of the beam 460. Moving the component may include any type of motion of the component or a portion of the component (such as a surface of the component that interacts with light). For example, moving may include one or more of shifting, rotating, turning, lateral motion of all or a portion of the component, any kind of shape change including a deformation or a change in an amount of curvature, and a change in an angle relative to incident light.

The I/O interface 567 is any kind of electronic interface that allows the control system 550 to receive and/or provide data and signals with an operator, the optical system 505, the beam turning system 452, the beam coupling optical system 432, the lithography exposure apparatus 115, and/or an automated process running on another electronic device. For example, the I/O interface 567 may include one or more of a visual display, a keyboard, and a communications interface.

FIGS. 6-13 show various implementations of the reflective optical element 434 and the beam turning optical system 452. Any of the reflective optical elements shown in FIGS. 6-9 may be used as the reflective optical element 434, and any of the beam turning optical systems shown in FIGS. 10-13 may be used as the beam turning optical system 452. An optical system may include any of the reflective optical elements shown in FIGS. 6-9 as the reflective optical element 434 and/or any of the beam turning optical systems shown in FIGS. 10-13 as the beam turning optical system 452. In other words, any of the reflective optical elements shown in FIGS. 6-9 may be used with any of the beam turning optical systems shown in FIGS. 10-13.

FIGS. 6-9 are side views of reflective optical elements 634, 734, 834, 934, respectively. Each of the reflective optical elements 634, 734, 834, 934 has a reflective surface that is oriented to receive the light beam 424, and the surface has a surface profile that determines how the surface reflects incident light. The surface profile may be determined by the radius of curvature of the surface, the material of the surface, and/or by physical characteristics of the surface (for example, the surface may include a blazed grating). Because the reflective optical element 434 forms part of the resonator cavity 457, the surface profile of the optical element 434 determines the modal content of the light in the resonator cavity 457.

Figure 6:
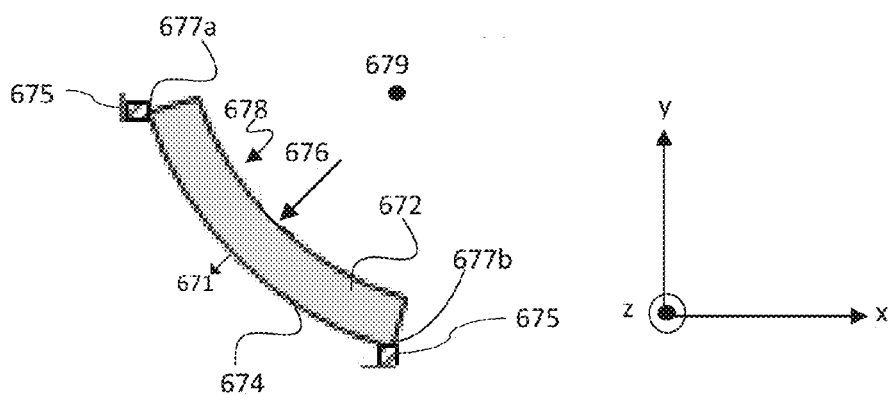
FIGS. 6-9 are side views of exemplary reflective optical elements.

FIG. 6 is a side view of the optical element 634 in the x-y plane. The optical element 634 extends in the z direction (into and/or out of the page) along an axis 679. The optical element 634 includes a body 672, which has an optically reflective surface 674. The optically reflective surface 674 may be any type of material that reflects the wavelengths in the beam 424. For example, the optically reflective surface 674 may be a mirror or a multi-layer dielectric stack designed to reflect the wavelengths in the beam 424.

The surface 674 defines a surface normal 671. The reflective surface 674 reflects incident light (including the beam 424) along the surface normal 671. The reflective surface 674 is curved in the x-y plane, thus, the surface normal 671 extends in more than one direction in the x-y plane. The reflective surface 674 may be, for example, a toroidal reflective surface (such as a cylindrical reflective surface) or another type of aspheric reflective surface. In the example shown in FIG. 6, the reflective surface 674 has a curvature that results in the surface 674 being convex relative to the beam 424 in the x-y plane, and the surface normal 671 extends radially outward from the surface 674.

The optical element 634 also includes one or more rigid fasteners 675. The body 672 is capable of being deformed in response to an applied force 676. The applied force 676 may be, for example, a mechanical force provided by a piezoelectric (PZT) actuator and/or a pneumatic pressure applied to a pneumatic cylinder. The applied force 676 may be any kind of a force, including a torque. The rigid fasteners 675 hold a portion of the body 672 at a fixed location when the force 676 is applied. By holding a portion of the body 672 at a fixed location while the force 676 is applied, the rigid fasteners 675 allow another portion of the body 672 not held by the rigid fasteners 675 to deform (for example, change shape) in response to the application of the force 676.

The rigid fasteners 675 may be rigid posts that hold a portion of the body 672 in a fixed location by making physical contact with the portion. In the example of FIG. 6, the rigid fasteners 675 include two posts. One of the posts is attached to the body 672 at an end 677a, and the other post is attached to the body 672 at an end 677b.

In the example shown in FIG. 6, the force 676 is applied to a side 678 of the body 672. The side 678 is opposite to the surface 674. The force 676 is applied along a direction that causes the curvature of the surface 674 to change. In the example shown, the force 676 is applied at the center of the body 672 and in a direction that is parallel to the surface normal 671 that extends from the center of the surface 674. By applying the force 676 at the side 678, the surface 674 is deformed. For example, the radius of curvature of the surface 674 may change by 1-10 microns ($\mu$m) in response to the application of the force 676. The amount of deformation is determined by the amount of force applied at the side 678. Thus, the curvature of the surface 674 may be varied by applying an appropriate about of force at the side 678.

The optical element 634 may be used as the reflective optical element 434 in the optical lithography system 400 or the optical lithography system 500. In the optical system 400, the optical element 434 does not receive command signals from a control system. When used in the optical lithography system 400, the reflective surface 674 of the optical element 634 is deformed to have a particular curvature, for example, when the optical lithography system 400 is assembled, or during maintenance, and the deformation is not purposefully adjusted during operation of the system 400.

When used in the optical lithography system 500, the optical element 434 may receive the command signal 557 from the control system 550. The optical element 434 responds to an instance of the command signal 557 by moving or adjusting. For example, the command signal 557 may include information that determines how much force is to be applied to the body 672, and the command signal 557 may be used to apply a particular amount of force at the side 678. The control system 550 provides the command signal 557 while the system 505 is operating, and may provide an instance of the command signal 557 each time a pulse of light is produced by the system 505. Thus, when the optical element 634 is used in the optical system 505, the surface 674 may be deformed, and may be deformed in a different way, for each pulse of light in the output beam 460.

Figure 7:
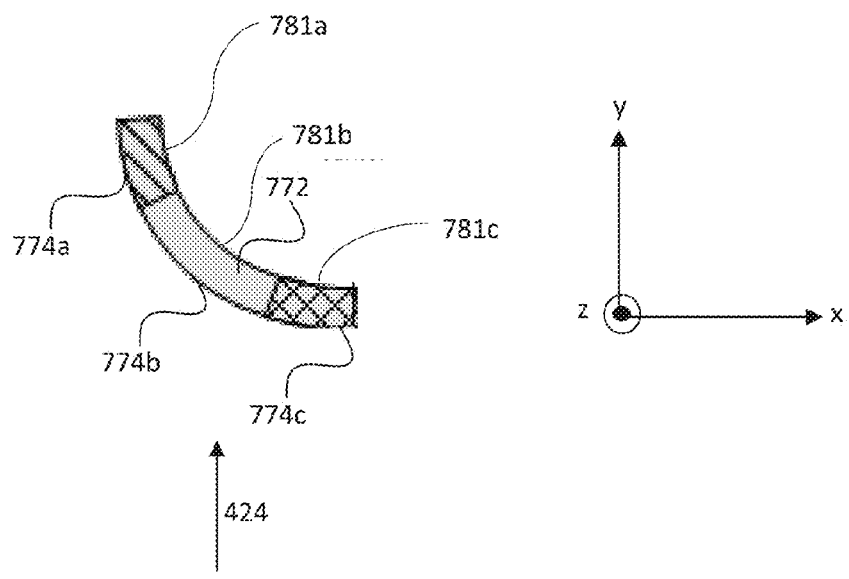

FIG. 7 shows a side view of a reflective optical element 734 in the x-y plane. The reflective optical element 734 extends in the z direction (into and/or out of the page). The reflective optical element 734 includes a body 772. The body 772 includes a plurality of segments 781, each of which has a reflective surface 774. Each reflective surface 774 may have a different surface profile. For example, one or more of the segments 781 may have a reflective surface with a different curvature than the reflective surfaces associated with the other segments. Although the body 772 includes the segments 781, and each segment 781 includes a reflective surface 774, the body 772 and surfaces 774 are physically joined or touching such that the reflective surface 774 does not intentionally include any discontinuities or regions that do not reflect light between two adjoining segments 781.

In the example shown, the body 772 includes three segments 781a, 781b, 781c. The segments 781a, 781b, 781c have corresponding reflective surfaces 774a, 774b, 774c. At least one of the reflective surfaces 774a, 774b, 774c has a different amount of curvature than another of the segments. In some implementations, each of the reflective surfaces 774a, 774b, 774c have a different curvature.

Figure 8:
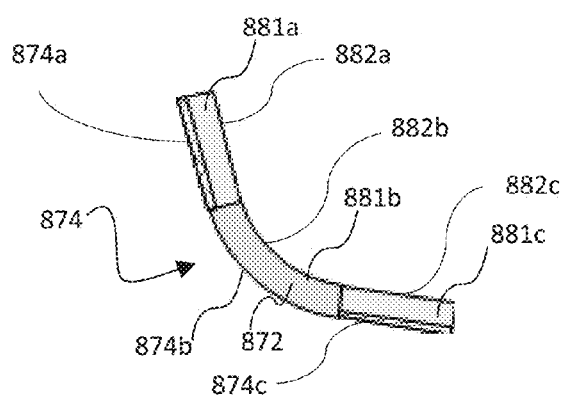
Figure 8:
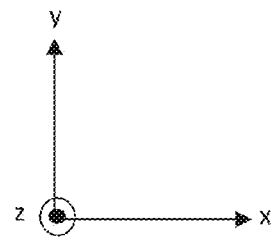

FIG. 8 is a side view of a reflective optical element 834 in the x-y plane. The optically reflective element 834 includes a body 872. The body 872 includes a plurality of segments, each of which has a reflective surface 874. The segments are joined such that the reflective surfaces form a continuous reflective surface that lacks regions that do not reflect light. In the example of FIG. 8, the body 872 includes segments 881a, 881b, 881c. The segments 881a, 881c include respective base portions 882a, 882c and reflective surfaces 874a, 874c. The reflective surfaces 874a and 874c are gratings. The gratings 874a and 874c may be identical or different. The segment 881b is a mirror that has a reflective surface 874b. The mirror may be a cylindrical mirror 881b that extends in the z direction (into and/or out of the page). The reflective surface 874b is curved. In the example of FIG. 8, the reflective surface 874b is convex in the x-y plane relative to the beam 424. The reflective surface 874 (which is the collection of reflective surfaces 874a, 874b, 874c) is also convex in the x-y plane relative to the beam 424.

The reflective optical element 834 may be used in the system 400 as the reflective optical element 434.

Figure 9:
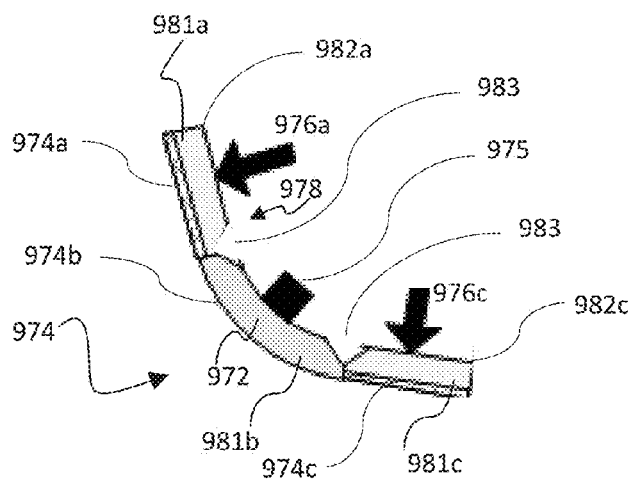
Figure 9:
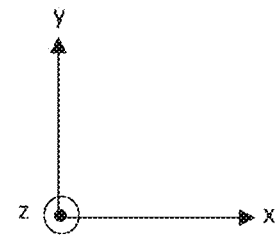

FIG. 9 is a side view of a reflective optical element 934, which includes a reflective surface 974, in the x-y plane. The reflective optical element 934 is similar to the reflective optical element 834 (FIG. 8), except that the surface profile of the reflective surface 974 may be changed while the reflective optical element 934 is being used.

The reflective optical element 934 includes a body 972 that has a reflective surface 974. The body 972 includes segments 981a, 981b, 981c, which have respective bases 982a, 982b, 982c and reflective surfaces 974a, 974b, 974c. The segments 981a, 981b, 981c are joined such that the reflective surface 974 (which is made up of the reflective surfaces 974a, 974b, 974c) is a continuous reflective surface that does not include any regions that are not optically reflective.

The reflective optical element 934 includes flexible connectors 983. One of the connectors 983 is between the segments 981a and 981b, and another flexible connector 983 is between the segments 981b and 981c. One of the flexible connectors 983 connects the segments 981a and 981b, and another of the flexible connectors 983 connects the segments 981b and 981c. The flexible connectors 983 connect the various segments on a side 978 such that the flexible connectors 983 do not impact the surface profile of the reflective surface 974. The flexible connectors 983 hold the segments 981a-981c allow the segments 981a-981c to move independently of each other in response to a force applied to a particular segment. However, the flexible connectors 983 have sufficient strength and rigidity such that the segments 981a-981c do not move relative to each other when a force is not applied. The flexible connectors 983 may be, for example, grooves that are formed between the portions. In the x-y plane, the grooves open to the side 978. The grooves may be v-shaped grooves that open to the side 978 and taper to a point in the x-y plane toward the reflective surface 974 (such as shown in FIG. 9). In some implementations, the grooves may be rounded grooves that are open to the side 978 and are rounded toward the reflective surface 974. Rounded grooves may distribute mechanical stress more effectively than other types of flexible connectors, and may result in the reflective optical element 934 being less prone to fracture when force is applied to one of more of the segments.

In the example of FIG. 9, the segment 981b is fixed in place by a post 975 attached to the segment 981b at the side 978. Independent forces 976a, 976c may be applied to segments 981a, 981c, respectively. The forces 976a, 976c may be applied using, for example, a PZT transducer. The forces 976a, 976c are applied in the x-y plane from the side 978. In the example shown in FIG. 9, the forces 976a, 976b are in a direction that is toward the respective surfaces 974a, 974c. However, the forces 976a, 976b may be applied in other directions in the x-y plane.

Application of the force 976a to the segment 981a causes the segment 981a and the reflective surface 974a to move relative to the segment 981b. Application of the force 976c to the segment 981c causes the segment 981c and the reflective surface 974c to move relative to the segment 981c. By moving either or both of the reflective surfaces 974a, 974c, the light that is reflected from the surfaces 974a, 974c may be steered into the gain medium 419 and toward the beam turning system 252.

The reflective optical element 934 may be used in the system 500 as the reflective optical element 434 and the surface profile of the reflective surface 1374 of the reflective optical element 934 may be changed while the system 500 is in operation. For example, the surface profile of the reflective surface 974 may be changed for each pulse of the light beam 424.

FIGS. 10-13 are side views of beam turning systems 1052, 1152, 1252, 1352 all of which are examples of implementations of the beam turning system 452. The beam 424 that propagates in the resonator cavity 457 may be represented by optical rays. In the examples of FIGS. 10-13, the ray labeled 424a is a ray that represents the propagation of the beam 424 when the modal content of the beam has not been changed to reduce the coherence of the beam 460. For example, the ray 424a may arise when the reflective optical element 434 is a cylindrical mirror that is not adjustable, and the beam turning optical system 452 is a corner cube reflector that is not adjustable and not large enough in the x-y plane to accommodate the ray 424b.

Figure 10:
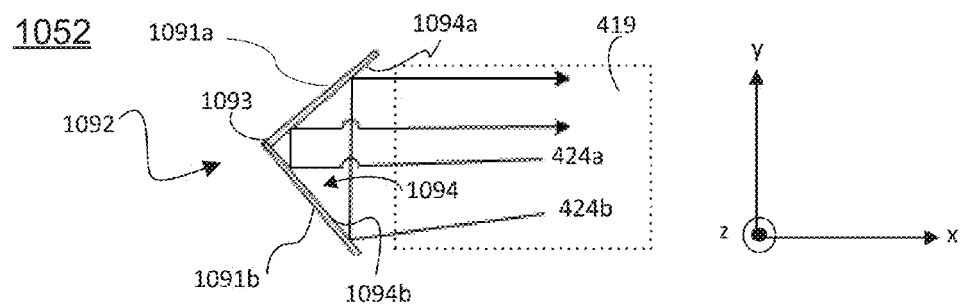
FIGS. 10-13 are side views of exemplary beam turning optical systems.
Figure 12:
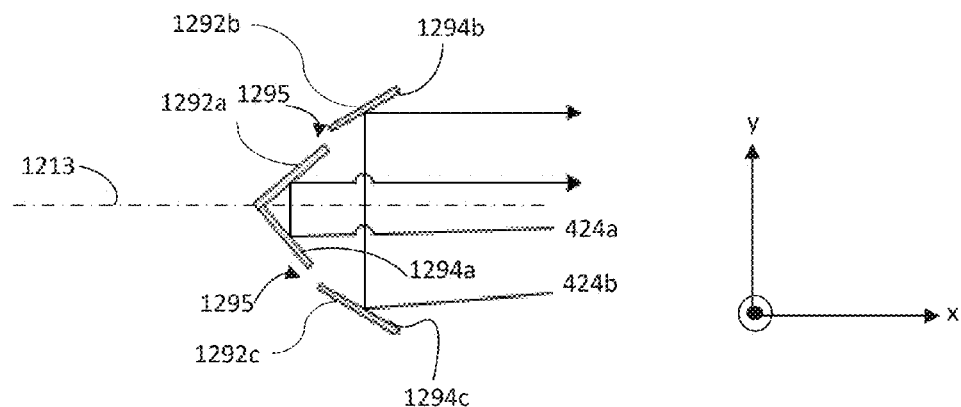
Figure 13:
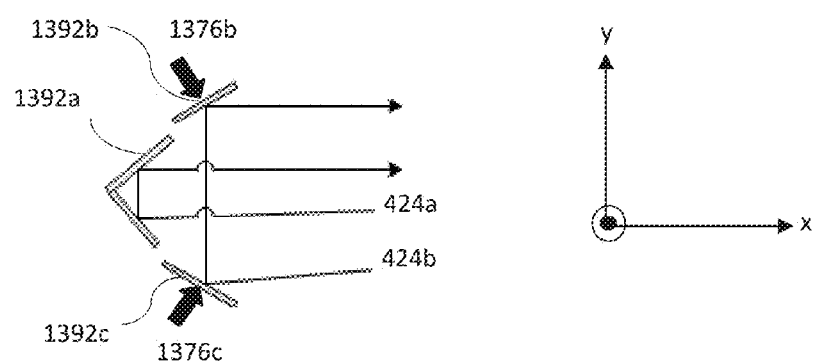

The ray 424b is a ray that propagates through the resonator cavity 457 in a manner that increases the lateral modes as compared to the ray 424a. The ray 424b may arise from using one of the reflective optical elements of FIGS. 6-9 as the reflective optical element 434. FIG. 10 shows an example beam turning system 1052 that is not adjustable but has a sufficiently expansive reflective surface to accommodate the ray 424b. As discussed below, the beam turning systems of FIGS. 11-13 are adjustable to accommodate rays such as the ray 424b. In this way, using one of the beam turning systems of FIGS. 11-13 as the beam turning system 452 may allow the modal content of the beam 424 to be increased, thereby decreasing the coherence of the beam 424 and reducing the presence of speckle.

Referring to FIG. 10, a side view of the beam turning system 1052 is shown. FIG. 10 shows the beam turning system 1052 in the x-y plane from the top side. The beam turning system 1052 includes a body 1092 and a reflective surface 1094. The body 1092 includes two portions 1091a, 1091b, which extend from a vertex 1093. The portions 1091a, 1091b are angled relative to each other. In the example of FIG. 10, the portions 1091a, 1091b form a right angle at the vertex 1093. However, the portions 1091a, 1091b may form other angles at the vertex 1093. The body 1092 may be a single integral component, or the portions 1091a, 1091b may be made from two separate portions that are physically joined.

The two portions 1091a, 1091b include respective reflective surfaces 1094a, 1094b. The ray 424b propagates in the medium 419 and is incident on the reflective surface 1094b, which reflects the ray 424b toward the reflective surface 1094a. The ray 424b is reflected by the surface 1094a and directed back in to the medium 419. The ray 424b propagates in the medium toward the optical coupler 433 (FIGS. 4 and 5).

Figure 11A:
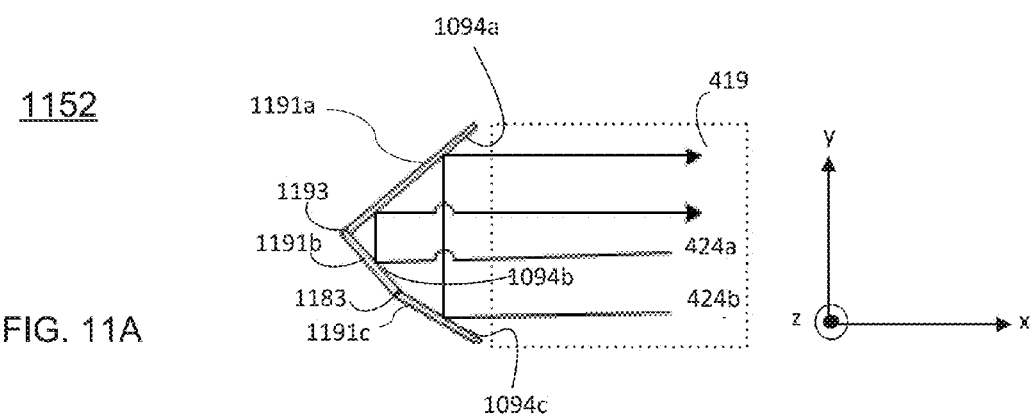

Referring to FIG. 11A, a side view of the beam turning system 1152 is shown. The beam turning system 1152 is similar to the beam turning system 1052 (FIG. 10), except the beam turning system 1152 includes a secondary portion 1191c, which may be positioned or moved relative to portions 1191a, 1192b. In the example shown, the portions 1191a, 1191b extend from a vertex 1193 at a right angle. The portion 1191c is physically connected to the portion 1191b, but is movable relative to the portion 1191b. For example, the portions 1191b and 1191c may be connected by a flexible portion 1183, which may be similar to the flexible portion 983 discussed above with respect to FIG. 9.

Each of the portions 1191a, 1191b, 1191c includes a respective reflective surface 1194a, 1194b, 1194c. The reflective surfaces 1194a, 1194b, 1194c collectively form a reflective surface 1194 of the beam turning system 1152. The reflective surface 1194 is a continuous reflective surface. Light from the medium 419 is incident on the reflective surface 1194b or 1194c, and these surfaces reflect the incident light to the reflective surface 1194a. The reflective surface 1194a directs the light back into the medium 419 and toward the optical coupler 433.

Figure 11B:
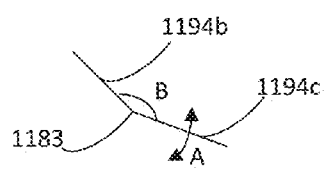

Referring also to FIG. 11B, the secondary portion 1191c may be positioned relative to the portion 1191b by moving the secondary portion 1191c in the x-y plane along an arc A while the portions 1191b, 1191c are connected by the flexible portion 1183. In this way, the angle between the reflective surfaces 1194b, 1194c may be changed. The angle is shown as angle B in FIG. 11. By changing the angle B, lateral mode growth in the resonator cavity 457 may be enhanced. For example, decreasing the angle B may result in the beam turning system 1152 being able to reflect more rays (such as the ray 424b) that arise from additional lateral modes.

The beam turning system 1152 may be used as the beam turning system 452 in the system 400 or the system 500. In some implementations, such as, for example, when the beam turning system 1152 is used in the system 400, secondary portion 1191c is positioned relative to the portion 1191b when the resonator cavity 457 is assembled or during maintenance and the angle B is not intentionally changed during operation of the system 400.

In some implementations, the secondary portion 1191c may be moved relative to the portion 1191b during operation of an optical system that includes the beam turning system 1152. For example, the beam turning system 1152 may be used as the beam turning system 452 in the system 500. In these implementations, the beam turning system 1152 includes an actuator that causes the portion 1191 to move in response to receiving the command signal 555. The actuator may be, for example, a PZT actuator that applies a force to the portion 1191c to cause the portion 1191 to move along the arc A during operation of the optical system. In these implementations, the portion 1191c may be moved to a different position along the arc A, for example, each time a pulse of light is produced. A correction to a pulse of light is based on information from a prior pulse. The prior pulse may be any pulse that precedes the pulse of light in time. For example, the prior pulse may be the pulse that immediately precedes the pulse of light in time, and/or a pulse that occurred before the immediately preceding pulse.

Referring to FIG. 12, a side view of a beam turning system 1252 is shown. The beam turning system includes a base body 1292a, which is positioned relative to a first wing body 1292b and a second wing body 1292c. The first and second wing bodies 1292b, 1292c are not physically connected to the base body 1292a. The first wing body 1292b is displaced from the base body 1292a in the x and y directions. The second wing body 1292c is displaced from the base body 1292a in the x and −y directions. The beam turning system 1252 may have mirror symmetry about an axis 1213, which is parallel to the x direction. The base body 1292a, the first wing body 1292b, and the second wing body 1292c include reflective surfaces 1294a, 1294b, 1294c, respectively. Together, the reflective surfaces 1294a, 1294b, 1294c form a reflective surface 1294. The reflective surface 1294 has gaps 1295 where the portions are separated. Thus, unlike the reflective surface 1194, for example, the reflective surface 1294 is not continuous.

The reflective surface 1294c of the first wing body 1292c receives the ray 424b from the gain medium 419 and directs the ray 424b toward the reflective surface 1294b of the second wing body 1292b. The ray 424b is reflected from the reflective surface 1294b, back into the gain medium 419 and toward the optical coupler 433. The reflective surfaces 1294b, 1294c are positioned to receive and reflect, respectively, the ray 424b. In this way, the first wing body 1292b and the second wing body 1292c enable additional lateral modes to propagate in the resonator cavity 457 as compared to a design that does not include the first and second wing bodies 1292b, 1292c. The beam turning system 1252 may be used as the beam turning system 452 in the system 400.

Referring to FIG. 13, a side view of a beam turning system 1352 is shown. The beam turning system 1352 is the same as the beam turning system 1252 (FIG. 12), except force 1376b, 1376c, respectively, may be applied to the first wing body 1292b and the second wing body 1292c while the beam turning system 1352 is in use and interacting with the beam 424 (which includes the rays 424a and 424b). The force 1376b and the force 1376c may be applied with, for example, a PZT actuator.

The beam turning system 1352 may be used in the system 500 as the beam turning system 452. The control signal 555 (FIG. 5) may be used to control the position of the first wing body 1392b and/or the second wing body 1392c.

Figure 14:
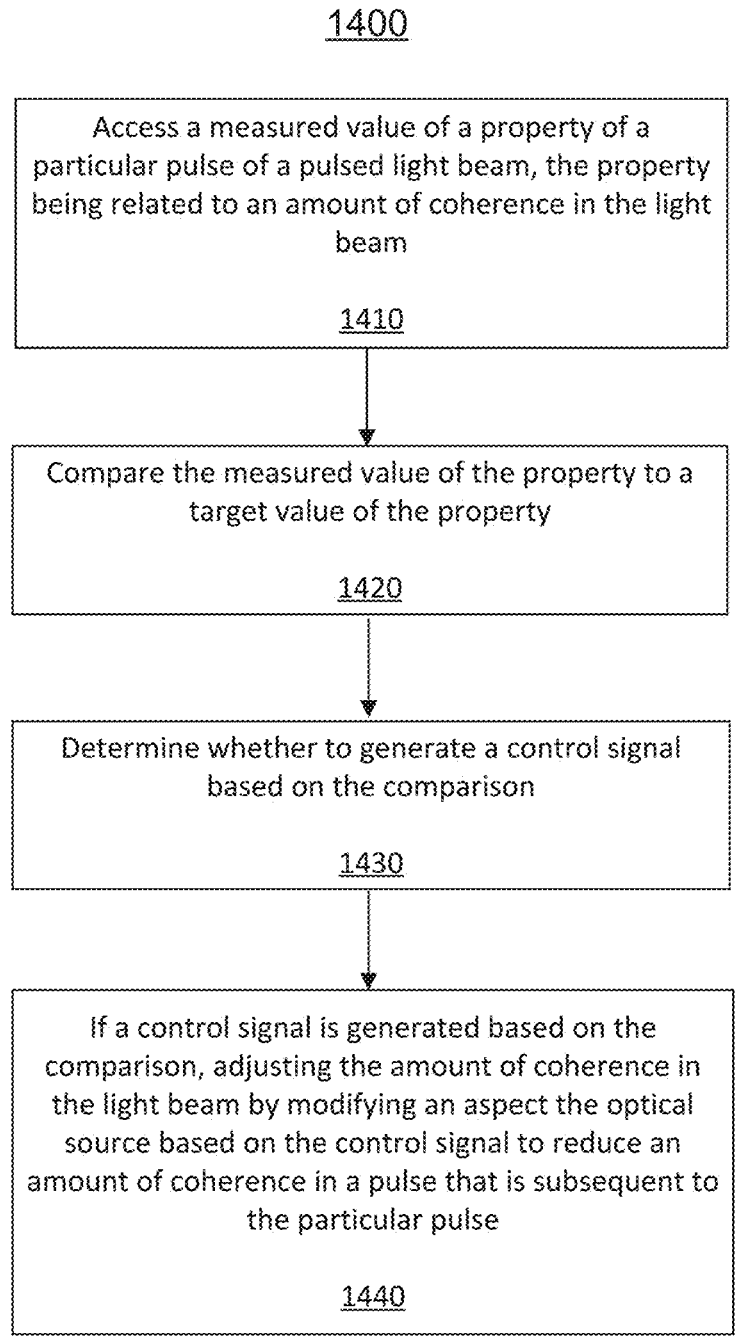
FIGS. 14 and 15 are flow charts of exemplary processes for controlling an optical system.

Referring to FIG. 14, a flow chart of an exemplary process 1400 is shown. The process 1400 may be used to control an optical system. For example, the process 1400 may be used to control an optical system that is part of an optical source (such as the source 105 of FIG. 1). The process 1400 may be used with any optical system, such as, for example, the optical system 405 or 505. The process 1400 may be used with an optical source (such as, for example, the optical source 105 or 205) that includes one or more optical systems. For example, the process 1400 may be used to control the optical source 205 and/or the PA 230 of the optical source 205. The process 1400 may be used implemented in a closed-loop control system, such as the system 500 (FIG. 5). The process 1400 is discussed first with respect to the system 500 of FIG. 5, which includes the optical system 505. The process 1400 may be performed by one or more electronic processors 564 of the control system 550 while the system 505 produces the light beam 460. The process 1400 may be performed on a pulse-by-pulse basis such that the process 1400 is performed on a particular pulse and the immediately subsequent pulse, or on all pulses within a subset of pulses. A subset of pulses is any set of pulses in the beam 460, and may be composed of non-consecutive pulses.

A measured value of a property of a particular pulse of the light beam 460 is accessed (1410). The particular pulse may be any pulse in the light beam 460. The property is related to an amount of coherence in the particular pulse. For example, the property may be a divergence of the particular pulse along the direction of propagation or an intensity profile of the pulse in a plane that is perpendicular to the direction of propagation of the pulse. The measured value of the property may be obtained from the metrology module 568, which receives a portion 551 of the light beam 460 from the optical beam monitoring optical system 562, or from the detector 122, which is in the lithography exposure apparatus. In some implementations, the measured value of the property of the particular pulse may be accessed from the electronic storage 566.

The measured value of the particular pulse may be measured at any point along the propagation path of the particular pulse. For example, the measured value may be the value of the property outside of the cavity 457 (for example, at the optical beam monitoring optical system 562), or the measured value may be a value of the property inside of the cavity 457. In some implementations, the measured value is obtained or derived from data collected by the detector 122, which is in the lithography exposure apparatus 115. Using data from the detector 122 may provide additional flexibility and accuracy when exposing microelectronic features that are on the edges of the wafer 120 (FIG. 1). Additionally, using data from the detector 122 may eliminate the need for the optical beam monitoring optical system 562.

The accessed measured value of the property is compared to a target value of the property (1420). The target value of the property may be a value of the property associated with optimal, proper, and/or acceptable operation of the optical system 505. The target value may be stored on the electronic storage 566. The measured value and the target value may be compared by, for example, subtracting the measured value and the target value to determine an error value for the particular pulse.

A control signal may be generated based on the comparison (1430). A control signal may be generated when the error value or other metric that represents the magnitude difference between the target value and the measured value exceeds a threshold. The threshold may encompass a range of values for the property about the target value. Thus, depending on the threshold, measured values that are close to but less than the target value or greater than but not the same as the target value may not result in the generation of a control signal. If the measured value and the target value are the same, then a control signal is not generated. The measured values may be determined from measuring the value of a property (such as divergence or intensity) for each pulse and averaging these values. For example, the value of the property may be measured for each pulse in a burst of pulses and the values averaged over the entire burst. In some implementations, the value may be measured for a plurality of pulses (for example, a group of pulses) that is other than all of the pulses in a burst. For example, the value may be measured for every other pulse in a burst, or for a subset of consecutive pulses in a burst (for example, a window of pulses). In another example, the value may be measured for all of the pulses in a first burst of pulses and for fewer than all in the next burst of pulses.

If a control signal is generated, the amount of coherence in the light beam 460 is adjusted by modifying the optical system 505 based on the control signal to reduce the amount of coherence in a pulse that is subsequent to the particular pulse (1440). The generated control signal may be the control signal 557, which is provided to the reflective optical element 434, and/or the control signal 555, which is provided to the beam turning optical system 452. The optical system 505 may be modified by moving or positioning all or a portion of either or both of the reflective optical element 434 and the beam turning optical system 452 based on the generated control signal.

For example, the reflective optical element 634 (FIG. 6) may be used as the element 434, and the beam turning system 1352 (FIG. 13) may be used as the beam turning system 452. In this example, a property of the beam 460 determined by the metrology module based on the portion 551 received from the beam monitoring optical system 562. It is determined that magnitude of the difference between the value of the property of the beam 460 and the target value of the property exceeds the threshold. The command signal is generated, and, in this example, the command signal includes the command signal 555, which is provided to the beam turning system 1352, and the command signal 557, which is provided to the reflective optical element 634.

The command signal 557 includes information sufficient to cause the force 676 (FIG. 6) to be applied to the side 678 of the reflective optical element 634. The amount of force 676 to be applied may be based on the amount of the difference between the measured value of the property and the target value. When the force 676 is applied to the reflective optical element 634, the surface 674 moves. Because portions of the surface 674 are held by the fasteners 675, moving the surface 674 changes the curvature of the surface 674. By adjusting the curvature of the surface 674, the cavity 457 is modified such that additional lateral modes are able to propagate in the cavity 457. This results in the beam 460 having a greater divergence and less coherence.

Similarly, the command signal 555, which is provided to the beam turning system 1352, includes information sufficient to cause either or both of the forces 1376b, 1376c (FIG. 13) to be applied to the first and second wing bodies 1392b, 1392c, respectively. The applied force results in the first and/or second wing bodies 1392b, 1392c moving relative to the base body 1392a. By moving the first wing body 1392b and/or the second wing body 1392c, the cavity 457 may be further modified to accommodate additional lateral modes, and the coherence of the beam 460 is decreased.

Additionally, when a control signal is generated, the value of the property may be measured again after the optical system 505 is modified based on the control signal to obtain a new value of the property. The new value of the property is compared to the target value. If the magnitude of the difference between the new value of the property and the target value still exceeds the threshold, a second command signal is generated and the optical system 505 is further modified. The process of measuring the value of the property after applying a generated control signal to the optical system 505 may be repeated. In some implementations, the process of measuring the property after applying a generated control signal may be repeated until the magnitude of the difference between the target value and the measured value is below the threshold, indicating that the coherence of the beam 460 is less than an acceptable amount. In some implementations, the value of the property may be measured, and a control signal may be generated and provided to the optical system 505 for each pulse in the beam 460.

If a control signal is not generated, then the measured value of the property is close to or equal to that of the target value. When the measured value of the property is close to or equal to that of the target value, the optical system 505 may be operating as expected, optimally, or acceptably and the beam 460 may have a relatively low amount of noise in the form of speckle. Thus, when a control signal is not generated, the value of the property may be a value that can be used as a target value at the particular operating conditions of the optical system 505. The operating conditions may include, for example, temperature in the cavity 457, pressure in the cavity 457, repetition rate, duty cycle, lifetime accumulated pulse count for the cavity 457, accumulated pulse count for the cavity 457 since the most recent gas injection, and total hours of operation. The value of the property when the command signal is not generated may be stored in the electronic storage in associated with one or more parameters that indicate the operating conditions. The operating parameters may include one or more of the temperature, the repetition rate, the duty cycle, a positioning of the reflective optical element 434 and/or the beam turning optical system 452, and an amount of force applied to the reflective optical element 434 and/or the beam turning optical system 452. The stored value may be used as the target value in future instances of operating the optical system 505 under the same conditions.

In this way, in addition being able to adjust the coherence of the beam 460, the process 1400 also may improve the performance of the optical system 505 by allowing the optical system 505 to quickly be adjusted to perform optimally under a wide range of operating conditions. For example, by storing parameters related to the measured value of the property at different repetition rates, the optical system 505 may rely on these stored values to quickly adapt to producing low coherence pulses after receiving a command signal 553 from the lithography exposure apparatus 115 or a command through the I/O interface 567 from an operator to change the repetition rate of the beam 460.

Figure 15:
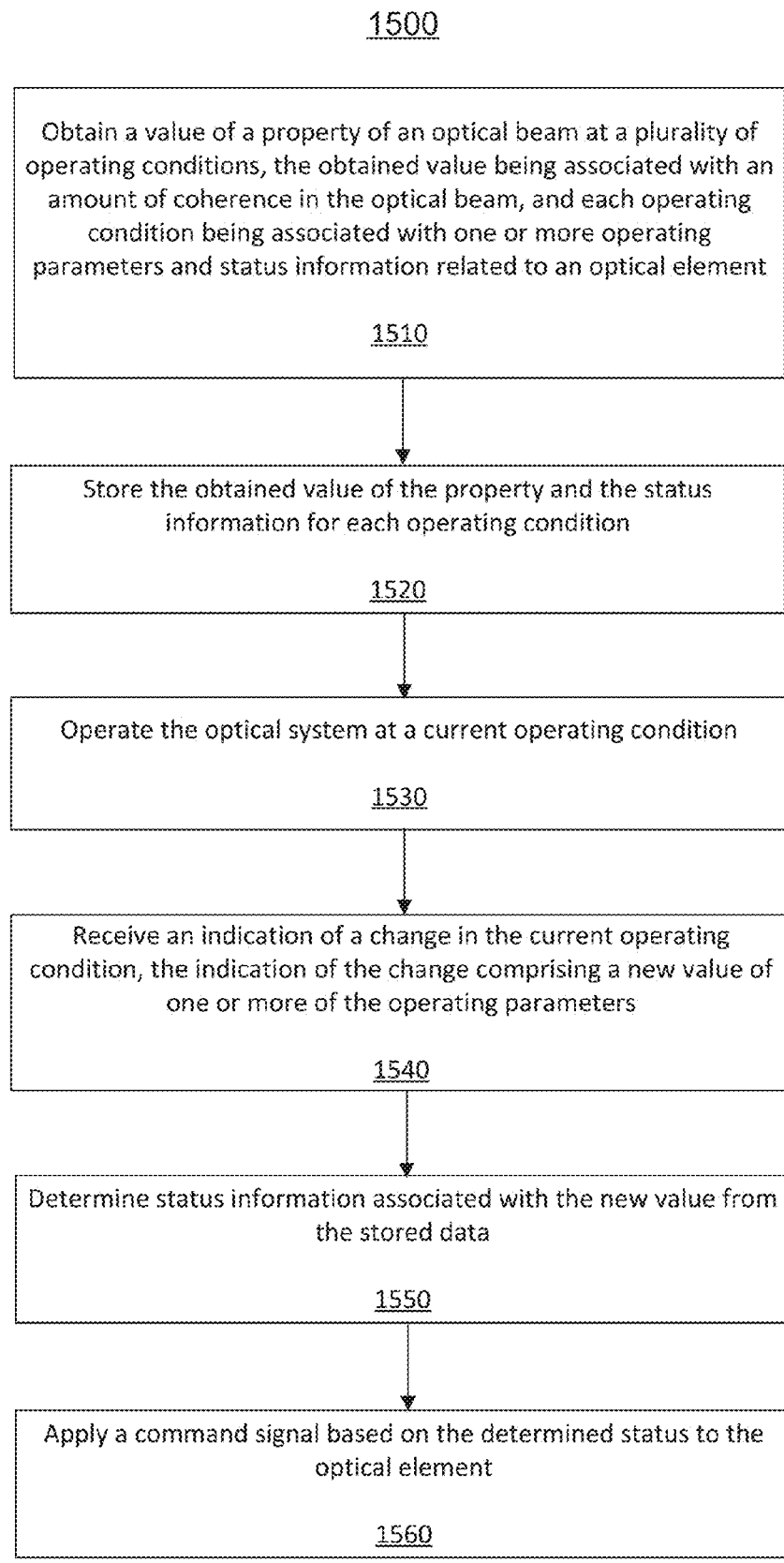

Referring to FIG. 15, a flow chart of an example of a process 1500 for controlling an optical system is shown. The process 1500 may be used to implement closed-loop control of an optical system to monitor the coherence of an optical beam produced by the optical system (or an optical beam produced by an optical source that includes the optical system) to ensure that the coherence does not add excessive noise in the form of speckle to the optical beam. The process 1500 modifies an aspect of the optical system to reduce the coherence when the amount of coherence exceeds a predetermined amount. For example, the process 1500 may modify a physical property of an optical element in the optical system.

The process 1500 may be used with any optical source, such as, for example, the optical source 105 or 205. The process 1400 may be used with an optical source (such as, for example, the optical source 105 or 205) that includes one or more optical systems. For example, the process 1400 may be used to control the optical source 205 and/or the PA 230 of the optical source 205. The process 1400 may be used with the optical system 405 or 505. The process 1500 is discussed with respect to the system 500 of FIG. 5. The process 1500 may be performed by one or more electronic processors 564 of the control system 550 while the system 500 produces the light beam 460. The process 1500 may be performed on a pulse-by-pulse basis such that the process 1500 is performed on a particular pulse and the immediately subsequent pulse, or on all pulses within a subset of pulses, where the subset of pulses is any set of pulses in the beam 460.

A value of a property of the optical beam 460 is obtained (1510). The optical beam 460 is a pulsed optical beam produced by the optical system 505. The property may be any property that is related to an amount of coherence in the light beam 460, or any property from which the amount of coherence of the light beam 460 may be derived or determined. For example, the property may be a divergence of the light beam 460 or a value that characterizes the intensity profile of the light beam 460 in a plane perpendicular to the direction of propagation of the light beam 460. In some implementations, the obtained value is obtained when the optical system 505 is performing at least as expected and perhaps is performing in an ideal or optimal fashion. Thus, in these implementations, the obtained values may be values that correspond to an acceptable amount of coherence being present in the beam 460.

The value of the property is obtained at more than one operating condition of the optical system 505. An operating condition of the system 505 is defined by one or more parameters, such as temperature and/or pressure in the cavity 457, the repetition rate of the beam 460, the duty cycle of the beam 460, and status information related to an optical element that includes an optical surface that interacts with the beam 424 in the cavity. The optical element may be, for example, any of the reflective optical elements 634-934 (FIGS. 6-9) or the beam turning optical systems 1052-1352 (FIGS. 10-13).

The status information related to the optical element may be any information that indicates how the optical surface of the optical element interacts with the light that propagates in the cavity 457. For example, the status information may indicate a position of the optical surface relative to the beam 424, relative to other portions of the optical element, and/or relative to other optical elements in the cavity. The status information may be an indication of an orientation of the optical surface relative to the light that propagates in the cavity 457. For example, the status information may include an angle of the optical surface relative to the longitudinal axis 413 (FIG. 5B) of the cavity or to a portion of the closed path 443. For optical elements that include an optical surface that moves in response to application of a force, such as the optical element 634 (FIG. 6), the optical element 934 (FIG. 9), the beam turning optical system 1152 (FIG. 11), and the beam turning optical system 1352 (FIG. 13), the status information may include an amount of force that is applied to the optical element.

The obtained value of the property and the status information are stored in the electronic storage 566 for each operating condition (1520). The obtained value of the property and the amount of applied force are stored in association with parameters that define the operating condition. The obtained value of the property and the amount of applied force may be stored in a look-up table that is indexed by the operating condition parameters. In some implementations, the obtained value of the property and the amount of applied force are stored in a database that is indexed by the operating condition parameters.

The optical system 505 is operated at a current operating condition (1530). The optical system 505 may be considered to be operating when the beam 460 is being produced. The current operating condition is defined by the operating parameters of the optical system (such as the repetition rate of the beam 460 and the temperature of the gain medium 419) and status information of the optical element while the beam 460 is being produced. The current operating condition may be a condition that is the operating condition for any number of pulses in the beam 460. For example, the operating condition may apply to all of the pulses in a burst of pulses, for a plurality of bursts, or for a single pulse. For example, the repetition rate of the beam 460 may define the operating condition of the optical system 505.

An indication of a change in the current operating condition is received (1540). The indication of a change includes a new value of one or more operating parameters of the optical system 505. For example, the indication of a change may include a new repetition rate for the beam 460. Thus, in this example, the new value is a new repetition rate. The indication of a change may be received from the lithography exposure apparatus 115 via the command signal 553. Thus, the lithography exposure apparatus 115 may command that the optical system 505 change one or more of the parameters such that the optical system 505 has a new operating condition. The indication of the change in the current operating condition may be received from an operator of the system 500. For example, the operator may enter the parameters associated with the new operating condition directly into the I/O interface 567.

Status information related to the optical element and associated with the new value of one or more of the operating parameters is determined (1550). The status information associated with the new value may be determined from the data stored in (1520). For example, the new value may be a new repetition rate, and the status information related to the optical element that is associated with the new repetition rate may be retrieved from the stored data. If the stored data does not include status information for the new value, status information associated with values of the parameter that are most similar to the new value may be used to estimate the status information for the new value. For example, if status information related to the optical element is known for several repetition rates greater than and less than the new repetition rate, the status information related to the optical element may be estimated from the status information that is available. For example, the status information may be tip-tilt information that describes the position of the optical surface at several different repetition rates. The tilt is the amount of deviation in the direction of propagation provided by the optical surface, and the tip is a direction that is orthogonal to the tilt. The tip-tilt information may be averaged or fit to a polynomial to estimate the tip-tilt values for the new repetition rate.

A command signal based on the determined status information is applied to the optical element (1560). The command signal may be, for example, the command signal 555, which is provided to the beam turning optical system 452, and/or the command signal 557, which is provided to the reflective optical element 434. Applying the command signal to the optical element may cause the optical surface of the optical element 434 to move in accordance with the command signal. For example, the command signal may be sufficient to drive a PZT actuator that causes the optical surface to move relative to other elements in the cavity 457 or to have a different curvature.

In some implementations, another value of a property of the light beam 460 is obtained after the command signal is provided to the optical element to determine whether the coherence of the beam 460 has been reduced as a result of applying the command signal to the optical element. The obtained other value may be compared to a value of the property known to be associated with an acceptable amount of coherence. If the obtained other value is not indicative of an acceptable amount of coherence, additional command signals may be applied and the value measured until the value of the property is indicative of an acceptable amount of coherence. For example, the additional command signals may have the effect of causing the optical element to be dithered about the initial position until the optical surface is positioned such that the value of the property indicates an acceptable amount of coherence in the beam 460.

When the value of the property indicates an acceptable amount of coherence in the beam 460, the status information related to the optical element may be stored in the electronic storage 566. For example, the status information may replace or update the status information that was previously stored in association with the operating condition in the look-up table or database. In this way, the process 1500 allows adaptation to changing circumstances that can affect the performance of the optical system 505 in a given operation condition. For example, components, such as the reflective optical element 434, the beam turning optical system 452, and/or the medium 419 may degrade over time such that the previously determined status information for a given operating condition becomes inaccurate.

In the process 1500, (1510) and (1520) may be performed at a different time using the system 505 than (1530-1560). In other words, the stored data that associates the status information of the optical element and the operating conditions may be created a prior and used at a later time to operate the system 505. The stored data may be used repeatedly. Additionally, as discussed above, the stored data may be updated to account for changing circumstances of the system 505.

Other implementations are within the scope of the claims.

What is claimed is:

1. A method of controlling an optical system, the optical system comprising two or more resonator optical elements that define a resonator cavity, the resonator cavity comprising a gain medium between at least two of the two or more resonator optical elements, the method comprising:
   accessing a measured value of a property of a particular pulse of a pulsed light beam emitted from the optical system, the property being related to an amount of coherence of the light beam;
   comparing the measured value of the property of the light beam to a target value of the property;
   determining whether to generate a control signal based on the comparison; and
   if a control signal is generated based on the comparison, adjusting the amount of coherence in the light beam by modifying an aspect of the resonator cavity based on the control signal to reduce an amount of coherence of a pulse that is subsequent to the particular pulse.

2. The method of claim 1, wherein the property of the light beam comprises a divergence of the light beam.

3. The method of claim 2, wherein the divergence of the light beam is measured outside of the optical system or outside of the resonator cavity.

4. The method of claim 1, wherein the pulse that is subsequent to the particular pulse is a pulse that immediately follows the particular pulse.

5. The method of claim 1, wherein adjusting the amount of coherence in the light beam by modifying an aspect of the resonator cavity based on the control signal comprises applying the control signal to at least one of the two or more resonator optical elements that define the resonator cavity, the at least one resonator optical element comprising an optical surface that interacts with the light beam in the resonator cavity to at least partially determine the value of the property of the light beam emitted from the optical system, the application of the control signal being sufficient to move the optical surface.

6. The method of claim 5, wherein the application of the control signal being sufficient to move the optical surface comprises the application of the control signal being sufficient to change the shape of the optical surface, change the position of the optical surface, change the angle of the optical surface relative to a direction of propagation of the pulsed light beam, or change a curvature of the optical surface.

7. The method of claim 5, wherein the optical surface comprises a plurality of portions, and application of the control signal is sufficient to move at least one of the plurality of portions of the optical surface relative to at least one of the other portions.

8. The method of claim 1, further comprising:
determining an operating condition of the optical system, the operating condition being associated with one or more operating parameters,
if a control signal is not generated based on the comparison, declaring the measured value of the property of the light beam as a desired value of the property for the determined operating condition.

9. The method of claim 8, wherein declaring the measured value of the property of the light beam as a desired value of the property for the determined operating condition comprises storing data comprising the measured value in association with the operating parameters of the operating condition.

10. The method of claim 9, wherein the operating parameters comprise any of a pressure of the gain medium of the resonator cavity, a temperature of the gain medium of the resonator cavity, a repetition rate of the light beam emitted from the optical system, an amount of force applied to an optical element comprising an optical surface that interacts with the light beam in the resonator cavity to at least partially determine the value of the property of the light beam emitted from the optical system, and an amount of force applied to an optical element comprising an optical surface that interacts with the light beam in the optical system to at least partially determine the value of the property of the light beam emitted from the optical system.

11. The method of claim 10, further comprising:
receiving an indication of a change in the operating condition of the optical system to a current operating condition;
determining the desired value of the property for the current operating condition from the stored data; and
setting the target value to the determined desired value.

12. The method of claim 11, wherein the indication of a change in the operating condition of the optical system comprises an indication of a change in the repetition rate of the light beam emitted from the optical system to a new repetition rate, and
the indication of the change in the repetition rate is received from a lithography exposure apparatus that receives the light beam from the optical system.

13. The method of claim 1, wherein accessing a measured value of a property of a light beam comprises measuring the value of the property of the light beam at a first time, and further comprising:
measuring the value of the property of the light beam at a second time, the second time occurring after the first time and after adjusting the amount of coherence in the light beam;
comparing the value of the property of the light beam at the second time to the target value; and
determining whether to generate a second control signal based on the comparison of the value of the property of the light beam at the second time to the target value.

14. The method of claim 1, wherein modifying an aspect of the resonator cavity comprises changing a geometry of the resonator cavity.

15. The method of claim 14, wherein the resonator cavity receives a seed light beam from a master oscillator, and the optical system provides the light beam to a photolithography system.

16. A method of controlling an optical system, the method comprising:
obtaining a value of a property of a light beam emitted from an optical system at a plurality of operating conditions, the obtained value of the property being associated with an amount of coherence in the light beam, and each of the operating conditions being associated with one or more operating parameters and status information related to an optical element, the optical element comprising an optical surface that interacts with the light beam to at least partially determine the obtained value of the property of the light beam;
storing the obtained value of the property and the status information related to the optical element for each operating condition as stored data;
operating the optical system at a current operating condition, the current operating condition being associated with current values of one or more of the operating parameters and a current status information related to the optical element;
receiving an indication of a change in the current operating condition of the optical system, the indication of a change comprising a new value of one or more of the operating parameters;
determining status information related to the optical element associated with the new value from the stored data; and
applying a command signal based on the determined status information to the optical element.

17. The method of claim 16, wherein the obtained value of the property of the light beam is associated with an acceptable amount of coherence in the light beam for each of the plurality of operating conditions, and further comprising:
obtaining another value of the property of the light beam by measuring the value of the property of the light beam after applying the command signal based on the determined status information to the optical element;
comparing the another value to the obtained value of the property associated with the new value of the one or more operating parameters; and
determining whether the another value of the property is acceptable based on the comparison.

18. The method of claim 17, wherein the status information and the determined status information comprise an amount of force applied to the optical element, and further comprising:
if the another value of the property is not acceptable, determining a third amount of force based on the new value and a pre-determined constant; and
applying the third amount of force to the optical element.

19. The method of claim 16, wherein the status information related to the optical element comprises a position of the surface of the optical element.

20. The method of claim 16, wherein the status information related to the optical element comprises an amount of force applied to the optical element, the force being sufficient to determine a position of the surface of the optical element.

21. A method of controlling an optical system, the method comprising:

accessing a measured value of a property of a particular pulse of a pulsed light beam emitted from the optical system, the property being related to an amount of coherence of the light beam;

comparing the measured value of the property of the light beam to a target value of the property;

determining whether to generate a control signal based on the comparison; and if a control signal is generated based on the comparison, adjusting the amount of coherence in the light beam by modifying an aspect of the optical system based on the control signal to reduce an amount of coherence of a pulse that is subsequent to the particular pulse, wherein adjusting the amount of coherence in the light beam by modifying an aspect of the optical system based on the control signal comprises modifying the value of the property by applying the control signal to an optical element of the optical system, the optical element comprising an optical surface that interacts with the light beam in the optical system to at least partially determine the value of the property of the light beam emitted from the optical system, the application of the control signal being sufficient to move the optical surface.

22. The method of claim 21, wherein the application of the control signal being sufficient to move the optical surface comprises the application of the control signal being sufficient to change the shape of the optical surface, change the position of the optical surface, change the angle of the optical surface relative to a direction of propagation of the pulsed light beam, or change a curvature of the optical surface.

23. The method of claim 21, wherein the optical surface comprises a plurality of portions, and application of the control signal is sufficient to move at least one of the plurality of portions of the optical surface relative to at least one of the other portions.

24. The method of claim 21, wherein the property of the light beam comprises a divergence of the light beam.

25. A method of controlling an optical system, the method comprising:

accessing a measured value of a property of a particular pulse of a pulsed light beam emitted from the optical system, the property being related to an amount of coherence of the light beam;

comparing the measured value of the property of the light beam to a target value of the property;

determining whether to generate a control signal based on the comparison;

if a control signal is generated based on the comparison, adjusting the amount of coherence in the light beam by modifying an aspect of the optical system based on the control signal to reduce an amount of coherence of a pulse that is subsequent to the particular pulse;

determining an operating condition of the optical system, the operating condition being associated with one or more operating parameters; and if a control signal is not generated based on the comparison, declaring the measured value of the property of the light beam as a desired value of the property for the determined operating condition.

26. The method of claim 25, wherein declaring the measured value of the property of the light beam as a desired value of the property for the determined operating condition comprises storing data comprising the measured value in association with the operating parameters of the operating condition.

27. The method of claim 26, further comprising:

receiving an indication of a change in the operating condition of the optical system to a current operating condition;

determining the desired value of the property for the current operating condition from the stored data; and setting the target value to the determined desired value.

28. The method of claim 27, wherein the indication of a change in the operating condition of the optical system comprises an indication of a change in the repetition rate of the light beam emitted from the optical system to a new repetition rate, and the indication of the change in the repetition rate is received from a lithography exposure apparatus that receives the light beam from the optical system.

* * * * *